United States Patent
Kim et al.

(10) Patent No.: US 9,696,911 B2
(45) Date of Patent: Jul. 4, 2017

(54) OPERATION METHOD OF NONVOLATILE MEMORY SYSTEM AND OPERATION METHOD OF USER SYSTEM INCLUDING THE SAME

(71) Applicant: SAMSUNG ELECTRONICS CO., LTD., Suwon-si, Gyeonggi-Do (KR)

(72) Inventors: Hyun-Ju Kim, Hwaseong-si (KR); Young Woo Jung, Gunpo-si (KR); Jeonghoon Cho, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/062,994

(22) Filed: Mar. 7, 2016

(65) Prior Publication Data

US 2016/0299689 A1    Oct. 13, 2016

(30) Foreign Application Priority Data

Apr. 7, 2015 (KR) .......................... 10-2015-0049045

(51) Int. Cl.
  *G06F 3/06* (2006.01)
  *G06F 12/02* (2006.01)

(52) U.S. Cl.
  CPC ............ *G06F 3/061* (2013.01); *G06F 3/0659* (2013.01); *G06F 3/0688* (2013.01); *G06F 12/0253* (2013.01); *G06F 2212/7205* (2013.01)

(58) Field of Classification Search
  CPC .. G11C 11/5628; G11C 16/10; G11C 13/0061
  See application file for complete search history.

(56) References Cited

U.S. PATENT DOCUMENTS

| | | | |
|---|---|---|---|
| 7,444,461 B2 | 10/2008 | Traister et al. | |
| 7,502,921 B2 | 3/2009 | Tomlin et al. | |
| 7,679,133 B2 | 3/2010 | Son et al. | |
| 7,797,498 B2 | 9/2010 | Jung et al. | |
| 8,417,876 B2 | 4/2013 | Gorobets et al. | |
| 8,468,294 B2 * | 6/2013 | Huang ................. | G11C 7/1042 365/185.03 |
| 8,504,784 B2 | 8/2013 | Traister | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,812,807 B2 | 8/2014 | Cho et al. | |
| 2006/0161724 A1 | 7/2006 | Bennett et al. | |
| 2007/0076492 A1 * | 4/2007 | Arakawa ............... | G11C 5/145 365/189.11 |

(Continued)

FOREIGN PATENT DOCUMENTS

| | | |
|---|---|---|
| JP | 2008-021335 | 1/2008 |
| KR | 1020100042885 | 4/2010 |

*Primary Examiner* — Tuan T Nguyen
(74) *Attorney, Agent, or Firm* — F. Chau & Associates, LLC

(57) ABSTRACT

A nonvolatile memory system includes a memory controller and a nonvolatile memory. A method of operating the nonvolatile memory system includes receiving a command that includes an urgency level from an external device, adjusting an operation time of an operation of the command based on the urgency level, completing the operation of the command within the adjusted operation time, and transmitting a completion response to the external device.

20 Claims, 18 Drawing Sheets

(56) References Cited

U.S. PATENT DOCUMENTS

| | | |
|---|---|---|
| 2010/0287217 A1 | 11/2010 | Borchers et al. |
| 2011/0233648 A1 | 9/2011 | Seol et al. |
| 2012/0159051 A1 | 6/2012 | Hida et al. |
| 2013/0073797 A1 | 3/2013 | Chowdhury |
| 2013/0185487 A1 | 7/2013 | Kim et al. |
| 2014/0204684 A1* | 7/2014 | Kwak ............... G11C 7/10 365/189.05 |
| 2014/0233316 A1* | 8/2014 | Shim ............... G11C 16/10 365/185.17 |
| 2016/0035428 A1* | 2/2016 | Jung ............... G11C 16/16 365/185.11 |
| 2016/0180959 A1* | 6/2016 | Darragh ............ G06F 3/0653 365/185.09 |

* cited by examiner ions, etc., it can be determined whether garbage collection should be performed. For example, if the number of free memory blocks of a flash memory is less than a predetermined number, or a free memory block in which data is to be written is insufficient, the flash memory will perform garbage collection. Since garbage collection repeatedly reads valid pages of a sacrificial block and writes the read valid pages to other memory, it consumes time. That is, since it is determined whether to perform garbage collection without considering a state of the external environment, such as a number of pending commands in a host, if garbage collection is performed in a memory sector where user or host requests have been concentrated, a user's subjective experience may be degraded.

SUMMARY

Example embodiments of the inventive concept provide a method of operating a nonvolatile memory system that includes a memory controller and a nonvolatile memory. The method includes receiving a command that includes an urgency level from an external device, adjusting an operation time of an operation of the command based on the urgency level, and completing the operation of the command within the adjusted operation.

In example embodiments, when the received command is a write command, adjusting an operation time of an operation of the command based on the urgency level includes adjusting a trigger condition for garbage collection based on the urgency level and determining whether to perform garbage collection based on the adjusted trigger condition; and if performance of garbage collection is required, adjusting a performance time of the garbage collection based on the urgency level.

In example embodiments, the command is a signal defined by an interface between the external device and the nonvolatile memory system and the urgency level is included in a reserved area of the command.

Example embodiments of the inventive concept provide a method of operating a nonvolatile memory system that includes a memory controller and a nonvolatile memory. The operation includes receiving a command that includes an urgency level from an external device; selecting one of a plurality of operation states based on the urgency level; and performing an operation of the command based on the selected operation state. A number of write operations or a read operations in each operation state is limited based on the urgency level while the operation of the command is performed.

In example embodiments, if a number of commands pending in the external device is greater than a predetermined number, the urgency level is high, and if the number of commands pending in the external device is less than the predetermined number, the urgency level is low.

In example embodiments, if the urgency level is high, the selected operation state is an urgent operation state. The urgent operation state is an operation state in which a number of write operations or read operations performed during the operation of the command is limited to N, where N is an integer equal to or greater than 0.

In example embodiments, if the urgency level is low, the selected operation state is a normal operation state. The normal operation state is an operation state in which a number of write operations or read operations performed during the operation of the command is limited to M, where M is an integer greater than N, or is not limited. The write operation and the read operation are performed in units of a page.

Example embodiments of the inventive concept provide a method of operating a nonvolatile memory system that includes a memory controller and a nonvolatile memory. The method includes receiving a first command from an external device; performing an operation of the first command; receiving a state command that includes a changed urgency level; adjusting an operation time of the operation of the first command based on the urgency level; and completing the operation of the first command within the adjusted operation time.

In example embodiments, the urgency level is determined by the external device based on any one of a pending time of a pending command exceeding a critical time, a number of pending commands exceeding a critical value, or receiving by the external device a high priority command.

In example embodiments, adjusting an operation time of the operation of the first command includes minimizing an operation time of garbage collection or stopping performance of garbage collection and performing the operation of the first command.

DETAILED DESCRIPTION

Figure 1:
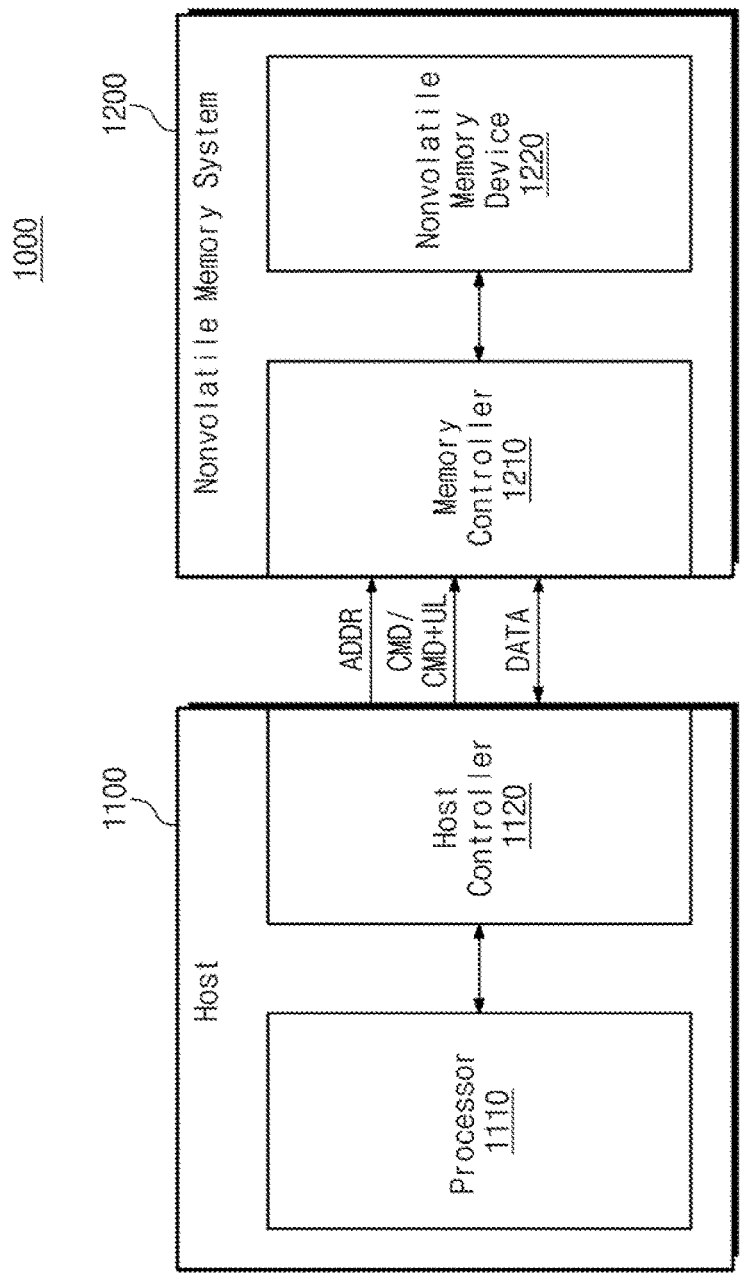
FIG. 1 is a block diagram of a user system in accordance with an embodiment of the inventive concept.

Embodiments of inventive concept will be described more fully hereinafter with reference to the accompanying drawings, in which example embodiments of the invention are shown. Embodiments of the inventive concept may, however, be embodied in many different forms and should not be construed as limited to the embodiments set forth herein. In the drawings, the size and relative sizes of layers and regions may be exaggerated for clarity. Like numbers may refer to like elements throughout.

A host in accordance with an embodiment of the inventive concept can determine an urgency level UL based on pending commands and can transmit the determined urgency level UL to a nonvolatile memory system. A nonvolatile memory system can adjust operation times according to an urgency level UL. Thus, since many commands may be processed in a short time due to an urgency level UL, a nonvolatile memory system having improved performance can be provided.

FIG. 1 is a block diagram of a user system in accordance with an embodiment of the inventive concept. Referring to FIG. 1, a user system 1000 includes a host 1100 and a nonvolatile memory system 1200. The user system 1000 may be a computer, an ultra mobile PC (UMPC), a workstation, a net-book, a personal digital assistant (PDA), a portable computer, a web tablet, a wireless phone, a mobile phone, a smart phone, a digital camera, a digital audio recorder, a digital picture recorder, a digital picture player, a device that can transmit and receive information in a wireless environment or one of various electronic devices that constitute a home network.

In example embodiments, the host 1100 includes a processor 1110 and a host controller 1120. The host 1100 can write data to the nonvolatile memory system 1200 or read data from the nonvolatile memory system 1200 according to a request of a user or application programs. The host 1100 may be provided as an application processor (AP).

In example embodiments, the processor 1110 controls an overall operation of the host 1100. For example, the processor 1110 can perform arithmetic operations for driving an operating system (OS) or various application programs.

In example embodiments, the host controller 1120 transmits an address ADDR and a command CMD to the nonvolatile memory system 1200 under control of the processor 1110. The host controller 1120 can exchange signals with the nonvolatile memory system 1200 over a predetermined interface. An interface between the host controller 1120 and the nonvolatile memory system 1200 may be at least one of various communication standards such as a universal serial bus (USB), a multimedia card (MMC), a peripheral component interconnection (PCI), a PCI-express, an advanced technology attachment (ATA), a serial-ATA, a parallel-ATA, a small computer small interface (SCSI), an enhanced small disk interface (ESDI), an integrated drive electronics (IDE), a Firewire, a universal flash storage (UFS), a nonvolatile memory-express (NVM-e), etc.

In example embodiments, the nonvolatile memory system 1200 includes a memory controller 1210 and a nonvolatile memory device 1220. The nonvolatile memory system 1200 can store data or transmit stored data to the host 1100 in response to signals received from the host 1100. The nonvolatile memory system 1200 may be provided as a storage device such as a multi-media card (MMC), a universal serial bus (USB) memory stick, a solid state drive (SSD), a universal flash storage (UFS), etc.

In example embodiments, the memory controller 1210 controls the nonvolatile memory device 1220 in response to signals received from the host 1100. The nonvolatile memory device 1220 can store data or output the stored data under control of the memory controller 1210. The nonvolatile memory device 1220 may include at least one semiconductor memory. For example, the nonvolatile memory device 1220 may be embodied as at least one nonvolatile memory device such as a NAND flash, a NOR flash, a PRAM, a ReRAM, a FRAM, a MRAM, etc.

In an embodiment of the present inventive concept, the nonvolatile memory device 1220 includes a three dimensional (3D) memory array. A 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, a 3D memory array includes vertical oriented NAND strings in which at least one memory cell is located over another memory cell. According to an embodiment, the at least one memory cell comprises a charge trap layer. Each vertical NAND string includes at least one select transistor located over memory cells, the at least one select transistor having the same structure as the memory cells and being formed monolithically together with the memory cells.

In example embodiments, the memory controller 1210 can perform various operations for effectively managing the nonvolatile memory device 1220. For example, the memory controller 1210 can perform garbage collection to free memory blocks of the nonvolatile memory device 1220. The memory controller 1210 can perform a wear leveling operation to manage lifespan of a plurality of memory blocks of the nonvolatile memory device 1220. The memory controller 1210 can perform a read reclaim operation to improve reliability of data stored in the nonvolatile memory device 1220. An operation of the memory controller 1210 can be performed by a flash translation layer (FTL).

In example embodiments, the host 1100 manages a command CMD to be transmitted to the nonvolatile memory system 1200. For example, the host 1100 manages a command CMD to be performed at the request of a user or application programs as a command queue. The host 1100 determines an urgency level UL based on the command CMD pending in the command queue.

In example embodiments, the host 1100 determines an urgency level UL of a command to be transmitted to the nonvolatile memory system 1200 based on the number of commands pending in a command queue, the pending time, and the number of priority commands. The urgency level indicates an urgency criterion of a command CMD to be transmitted to the nonvolatile memory system 1200.

For example, if there are a large number of pending commands, i.e., commands to be performed in the nonvolatile memory system 1200, the urgency level UL may rise. In this case, the nonvolatile memory system 1200 can improve a user's subjective experience by rapidly processing operations with respect to a command CMD. On the other hand, if there are a small number of pending commands, the urgency level UL may be lowered. In this case, the nonvolatile memory system 1200 can perform an operation with respect to the command CMD and an additional operation, such as garbage collection, and thereby efficiently managing the nonvolatile memory system 1200 and maintaining a user's experience.

In example embodiments, pending commands are managed by the host 1100 and refer to commands that are not being processed or performed by the nonvolatile memory system 1200.

In example embodiments, the nonvolatile memory system 1200 adjusts processing time or operation time of the received command CMD based on an urgency level UL received from the host 1100. For example, if a high urgency level is received from the host 1100, the nonvolatile memory system 1200 reduces an operation time corresponding to the received command CMD. The operation time corresponding to the received command CMD refers to the time from when a command CMD is received from the host 1100 until when a response to the command CMD is transmitted to the host 1100.

If the received command CMD is a write command, the nonvolatile memory system 1200 may perform garbage collection to free a memory block while performing the write operation. In this case, an operation time corresponding to the command CMD includes an execution time of writing data and time of performing the garbage collection. If a high urgency level is received from the host 1100 together with a command CMD, the nonvolatile memory system 1200 can reduce the operation time corresponding to the command CMD by shortening the performance time of the garbage collection.

In example embodiments, if a high UL is received from the host 1100 together with a command CMD, the nonvolatile memory system 1200 can reduce the operation time corresponding to the command CMD by adjusting a trigger condition of the garbage collection. For example, if the number of free blocks is less than a critical value, the nonvolatile memory system 1200 performs the garbage collection. If a high urgency level is received from the host 1100 together with a command CMD, the nonvolatile memory system 1200 can avoid performing garbage collection by increasing the critical value. Thus, the operation time corresponding to the command CMD can be reduced.

In example embodiments, if a high urgency level UL is received from the host 1100 together with a command CMD, the nonvolatile memory system 1200 can operate in a high speed write mode. For example, the nonvolatile memory system 1200 can operate as a single level cell (SLC) mode to reduce a write operation time.

As described above, the host 1100 determines an urgency level UL based on pending commands CMD and transmits the determined urgency level UL to the nonvolatile memory system 1200 together with the command CMD. In example embodiments, the host 1100 transmits a command CMD+UL that includes an urgency level UL to the nonvolatile memory system 1200. That is, the host 1100 includes information of the urgency level UL in a reserved area of a command defined by an interface between the host 1100 and the nonvolatile memory system 1200 to transmit the command CMD+UL to the nonvolatile memory system 1200.

In example embodiments, the nonvolatile memory system 1200 adjusts operation time corresponding to a command CMD according to an urgency level UL from the host 1100. The nonvolatile memory system 1200 can complete an operation corresponding to the command CMD within the adjusted operation time. That is, when many commands CMD are concentrated within a specific time frame due to requests from the host 1100, such as a user or application programs, the nonvolatile memory system 1200 can process the commands in a short time by reducing operation times corresponding to the commands. Thus, a nonvolatile memory system having improved performance can be provided.

Figure 2:
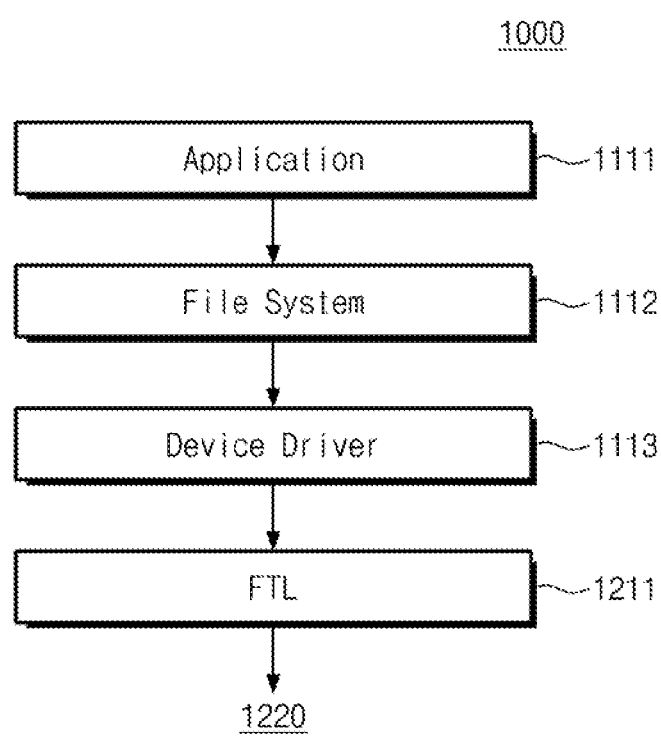
FIG. 2 is a block diagram of a software layer of the user system of FIG. 1.

FIG. 2 is a block diagram of a software layer of the user system of FIG. 1. Referring to FIGS. 1 and 2, a software layer of the user system 1000 includes an application 1111, a file system 1112, a device driver 1113 and a flash translation layer 1211. In example embodiments, the application 1111, the file system 1112, and the device driver 1113 are driven by the processor 1110 of the host 1100.

The application 1111 may be any of various application programs executing in an operating system (OS) of the host 1100. For example, the application 1111 may be a text editor, a video player, a web browser, etc.

When storing a file or data being used by the application 1111 in the nonvolatile memory device 1220, the file system 1112 organizes the file or data. For example, the file system 1112 provides an address ADDR for a file or data. The address ADDR can be a logical address being managed by the file system 1112. The file system 1112 may be provided in various forms depending on the operating system. For example, the file system 1112 may be a file allocation table (FAT), a FAT32, an NT file system (NTFS), a hierarchical file system (HFS), a journaled file system2 (JSF2), an XFS, an on-disk structure-5 (ODS-5), a UDF, a ZFS, a Unix file system (UFS), an ext2, an ext3, an ext4, a ReiserFS, a Reiser4, an ISO 9660, a Gnome VFS, a BFS, or a WinFS, etc. The file system 1112 can define data by a sector unit.

The device driver 1113 is a program that controls devices included in the host 1100 and devices connected to the host 1100. The device driver 1113 translates general input/output commands of an operating system into a message corresponding to each device. The device driver 1113 controls the nonvolatile memory system 1200. For example, the device driver 1113 can transmit a command CMD, an address ADDR and data DATA to the nonvolatile memory system 1200 according to a read or write request from a user, an application or an operating system. The device driver 1113 can transmit various signals to the nonvolatile memory system 1200 through the host controller 1120.

In example embodiments, the device driver 1113 manages a command CMD based on a read or write request from a user, an application or an operating system, as a command queue. The device driver 1130 transmits a command CMD to the nonvolatile memory system 1200 based on the command queue. The device driver 1130 determines an urgency level UL based on pending commands in the command queue to transmit the determined urgency level UL to the nonvolatile memory system 1200.

In example embodiments, the flash translation layer 1211, hereinafter referred to as 'FTL', provides an interface between the host 1100 and the nonvolatile memory device 1220 to efficiently use the nonvolatile memory device 1220. For example, the nonvolatile memory device 1220 can write and read data in units of pages. However, since the file system 1112 manages data or a file in units of sectors, the FTL 1211 translates a received address ADDR into an available physical address in the nonvolatile memory device 1220. The FTL 1211 may manage the address translation operation through a mapping table.

In example embodiments, the FTL 1211 performs operations such as garbage collection, wear leveling, read reclaim, etc. For example, the FTL 1211 manages the number of program/erase operations of memory blocks in the nonvolatile memory device 1220 and on the basis of this, may perform a wear leveling to standardize the number of program/erase operations of the memory blocks. The FTL 1211 may perform garbage collection of valid data in at least one memory block to free the memory block and erase the at least one memory block. The FTL 1211 may perform a read reclaim operation for a page or a memory block in which the number of error bits is greater than a predetermined value to guarantee reliability of data stored in the nonvolatile memory device 1220.

In example embodiments, the FTL 1211 adjusts operation times based on an urgency level UL received from the host 1100. For example, the FTL 1211 adjusts a garbage collection performance time or operation stage based on an urgency level UL received from the host 1100.

Figure 3:
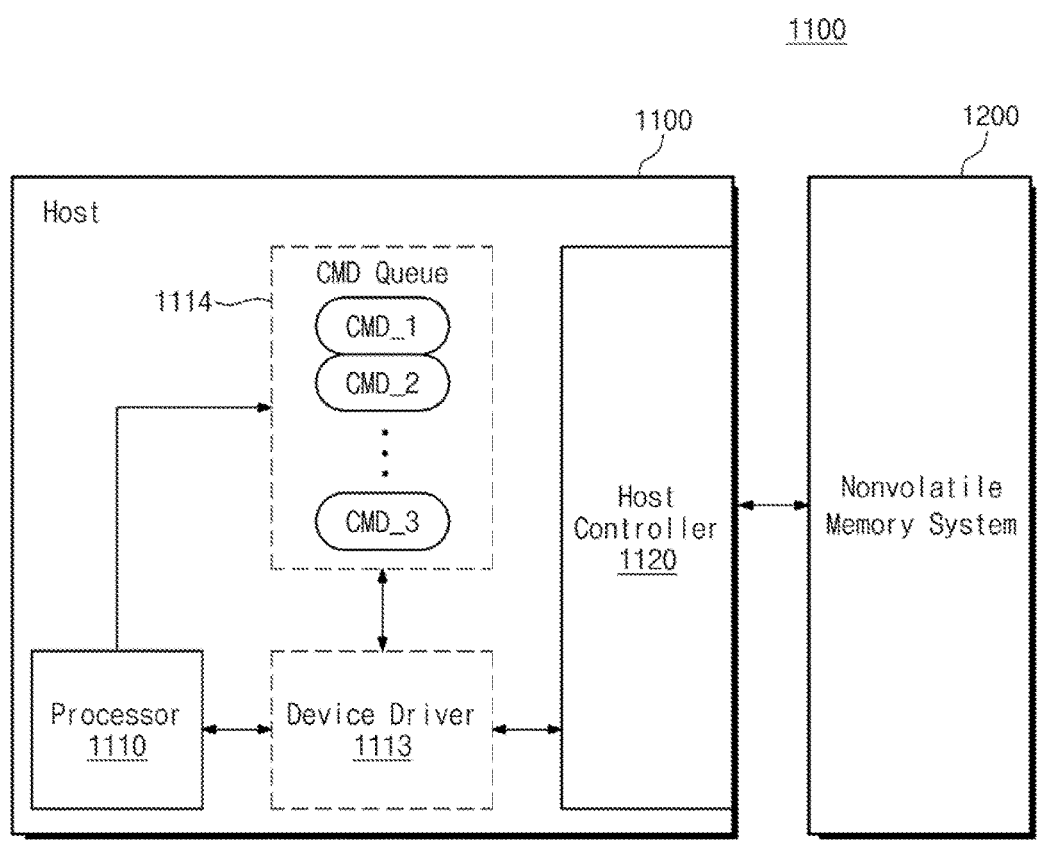
FIG. 3 is a block diagram of the user system of FIG. 1 in further detail.

FIG. 3 is a block diagram of the user system of FIG. 1 in further detail. Referring to FIGS. 1 and 3, the user system 1000 includes the host 1100 and the nonvolatile memory system 1200. The host 1100 includes the processor 1110, the host controller 1120, the device driver 1113 and a command queue 1114. Since the processor 1110 and the host controller 1120 were described with reference to FIG. 1, a further detailed description thereof is omitted.

The device driver 1113 and the command queue 1114 may be provided as software or firmware. The device driver 1113 and the command queue 1114 can be stored in an operation memory of the host 1100 and are driven by the processor 1110.

The command queue 1114 can include commands CMD_1, CMD_2, CMD_3 with respect to operations requested by the processor 1110. The command queue 1114 may sequentially arrange commands based on a request of the processor 1110 or on the command priorities. In example embodiments, the command queue 1114 is embodied as a circulation queue.

In example embodiments, the device driver 1113 sequentially transmits commands CMD in the command queue 1114 to the nonvolatile memory system 1200. The device driver 1113 transmits a command CMD to the nonvolatile memory system 1200 through the host controller 1120.

In example embodiments, the device driver 1113 determines an urgency level UL based on commands CMD in the command queue 1114. Table 1 shows example urgency levels UL based on commands CMD in the command queue 1114.

TABLE 1

| Urgency level (UL) | Number of pending commands (pn) | Pending time (pt) of command to be transmitted | Number of priority commands (pm) |
|---|---|---|---|
| HIGH | $pn > pn1$ | $pt > pt1$ | $pm > pm1$ |
| MEDIUM | $pn1 > pn > pn2$ | $pt1 > pt > pt2$ | $pm1 > pm > pm2$ |
| LOW | $pn < pn2$ | $pt < pt2$ | $pm < pm2$ |

Referring to Table 1, if the number (pn) of commands pending in the command queue 1114 is greater than a first critical value (pn1), the device driver 1113 determines an urgency level UL to be HIGH. If the number (pn) of commands pending in the command queue 1114 is less than the first critical value (pn1) and greater than a second critical value (pn2), where the second critical value (pn2) is less than the first critical value (n1), the device driver 1113 determines an urgency level UL to be MEDIUM. If the number (pn) of commands pending in the command queue 1114 is less than the second critical value (pn2), the device driver 1113 determines an urgency level UL to be LOW.

Alternatively, If a pending time (pt) of a command to be transmitted is greater than a first time (pt1), the device driver 1113 determines an urgency level UL to be HIGH. If the pending time (pt) of a command to be transmitted is less than the first time (pt1) and greater than a second time (pt2), where the second time (pt2) is less than the first time (pt1), the device driver 1113 determines an urgency level UL to be MEDIUM. If the pending time (pt) of a command to be transmitted is less than the second time (pt2), the device driver 1113 determines an urgency level UL to be LOW. The pending time (pt) of a command to be transmitted may be replaced by pending times of a plurality of commands pending in the command queue.

Alternatively, if the number (pm) of priority commands pending in the command queue 1114 is greater than a first critical value (pm1), the device driver 1113 sets an urgency level UL to be HIGH. If the number (pm) of priority commands pending in the command queue 1114 is less than the first critical value (pm1) and greater than a second critical value (pm2), where the second critical value (pm2) is less than the first critical value (pm1), the device driver 1113 sets an urgency level UL to be MEDIUM. If the number (pm) of priority commands pending in the command queue 1114 is less than the second critical value (pm2), the device driver 1113 sets an urgency level UL to be LOW. A command having high priority with respect to the nonvolatile memory system 1200 may be a read command.

The classification of urgency levels UL described above is illustrative and embodiments of the inventive concept are not limited thereto. For example, an urgency level UL determined by the device driver 1113 may be further subdivided.

In example embodiments, the device driver 1113 transmits the determined urgency level UL to the nonvolatile memory system 1200 together with a command CMD. For example, the host controller 1120 receives information and a command CMD about an urgency level UL from the device driver 1113. The host controller 1120 transmits information and a command CMD to the nonvolatile memory system 1200. The host controller 1120 communicates with the nonvolatile memory system 1200 through a predetermined interface. The command CMD may be a signal or command defined by the predetermined interface. The host controller 1120 adds information regarding the urgency level UL to a reserved area of the command defined by the predetermined interface and transmits the command CMD+UL to the nonvolatile memory system 1200.

In example embodiments, the nonvolatile memory system 1200 operates in response to a command CMD and an urgency level UL received from the host 1100. For example, the nonvolatile memory system 1200 adjusts an operation time of the received command CMD on the basis of the urgency level UL received from the host 1100. If the urgency level UL is HIGH, the nonvolatile memory system 1200 adjusts the operation time of the received command CMD to be a first time. If the urgency level UL is MEDIUM, the nonvolatile memory system 1200 adjusts the operation time of the received command CMD to be a second time longer than the first time. If the urgency level UL is LOW, the nonvolatile memory system 1200 adjusts the operation time of the received command CMD to be a third time longer than the second time.

As described above, the host 1100 determines an urgency level UL based on a command pending in the command queue 1114 and transmits the determined the urgency level UL to the nonvolatile memory system 1200. The nonvolatile memory system 1200 adjusts the operation time of the command CMD based on the urgency level UL. That is, if the urgency level UL is high, the nonvolatile memory system 1200 reduces an operation time of the command CMD based on the number of pending commands, the pending time and the number of priority commands, which can improve the performance of a nonvolatile memory system.

Figure 4:
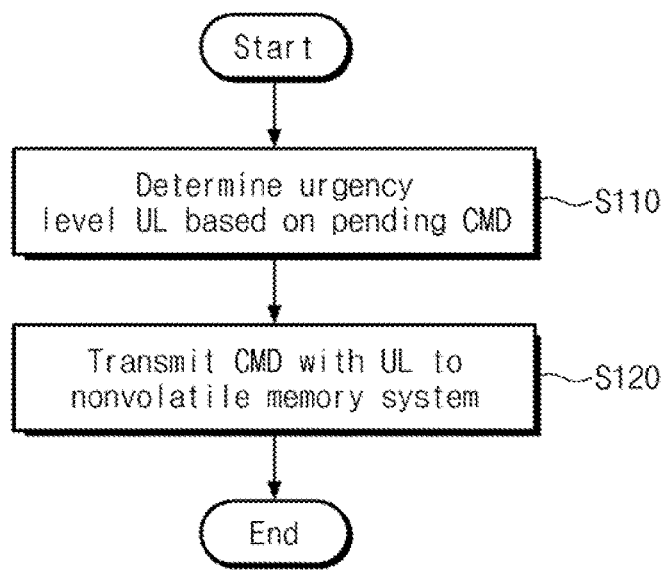
FIG. 4 is a flowchart of an operation of a host of FIG. 1.
Figure 5:
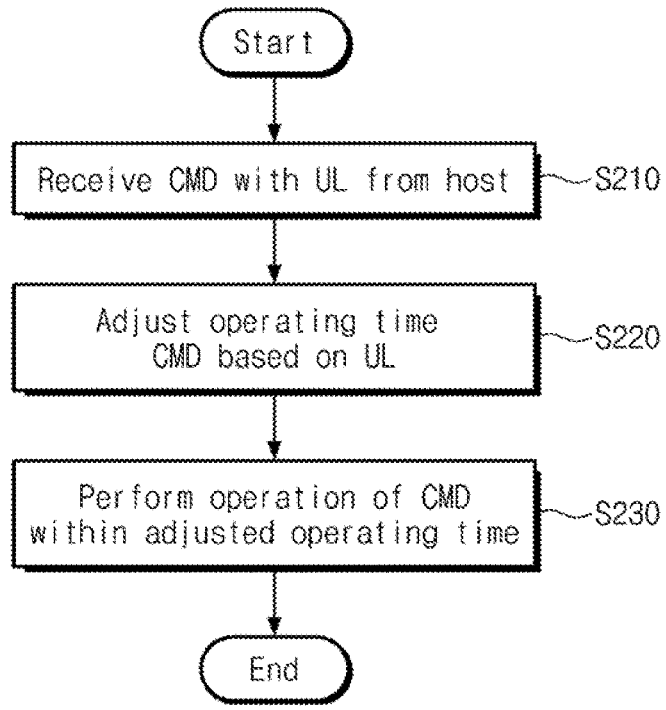
FIG. 5 is a flowchart of an operation of a nonvolatile memory system of FIG. 1.

FIG. 4 is a flowchart of an operation of a host of FIG. 1. FIG. 5 is a flowchart of an operation of a nonvolatile memory of FIG. 1. Referring to FIGS. 1 and 4, in step S110, the host 1100 determines an urgency level UL based on a pending command(s). For example, as described above with reference to FIG. 3 and Table 1, the host 1100 determines an urgency level UL based on a pending command CMD.

In step S120, the host 1100 transmits the command CMD and the urgency level UL to the nonvolatile memory system 1200. For example, as described above with reference to FIG. 3, the host 1100 and the nonvolatile memory system 1200 communicate with each other over a predetermined interface. A command CMD being transmitted to the nonvolatile memory system 1200 can be a signal or command defined by the predetermined interface. The host 1100 adds information regarding the urgency level UL in a reserved area of the command defined by the predetermined interface to transmit the command CMD+UL to the nonvolatile memory system 1200.

Referring to FIGS. 1 and 5, in step S210, the nonvolatile memory system 1200 receives a command CMD and an urgency level UL from the host 1100. As described above, the command CMD is a signal defined by the predetermined interface and the reserved area of the command CMD includes information regarding the urgency level UL.

In step S220, the nonvolatile memory system 1200 adjusts an operation time of the command CMD based on the urgency level UL. For example, as described above with reference to FIG. 3, the nonvolatile memory system 1200 adjusts an operation time of the command CMD. In step S230, an operation of the command CMD is performed by the nonvolatile memory system 1200 within the adjusted operating time.

Figure 6:
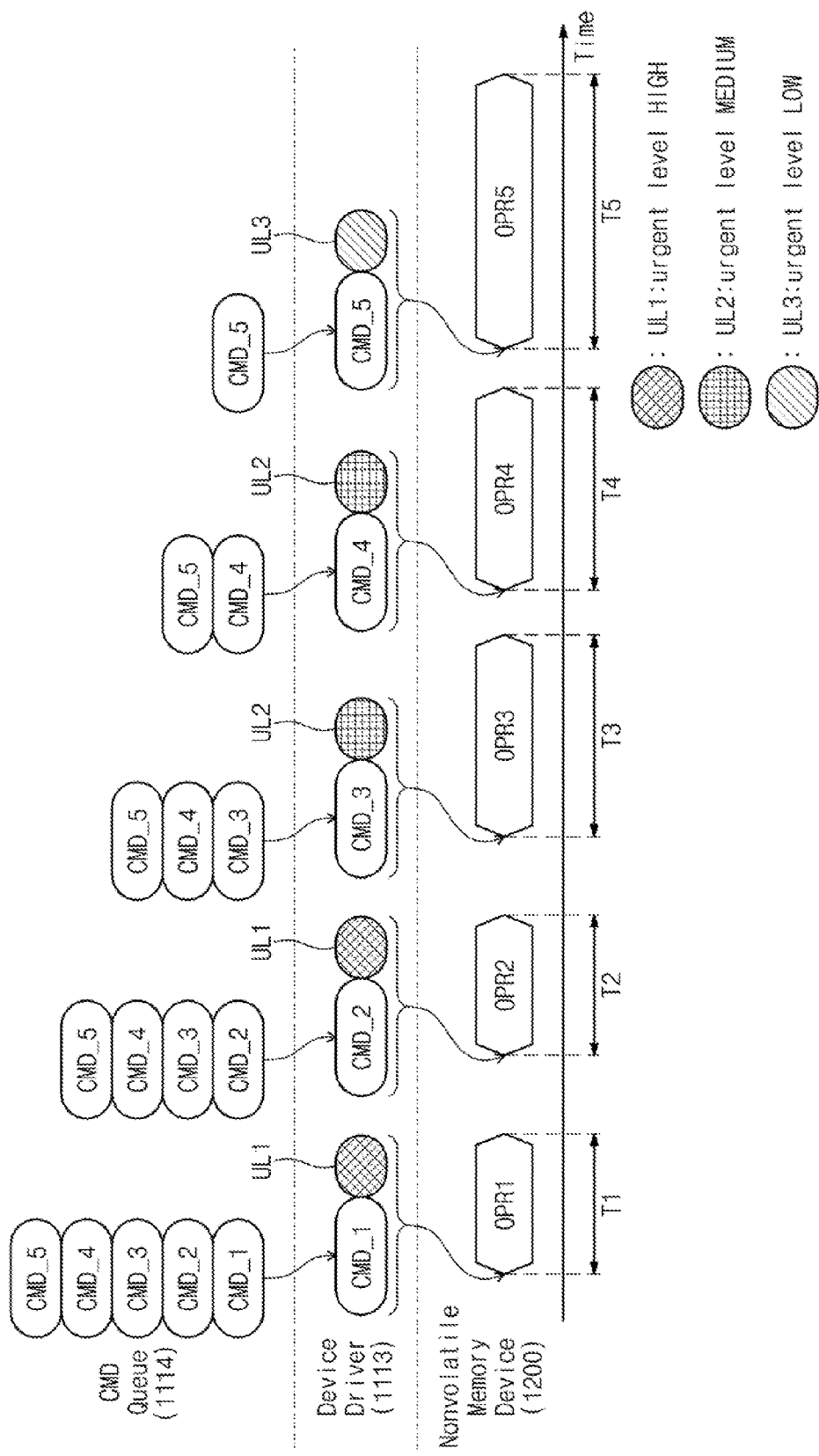
FIGS. 6 through 8 are timing diagrams that illustrate operations of the user system of FIG. 1.
Figure 7:
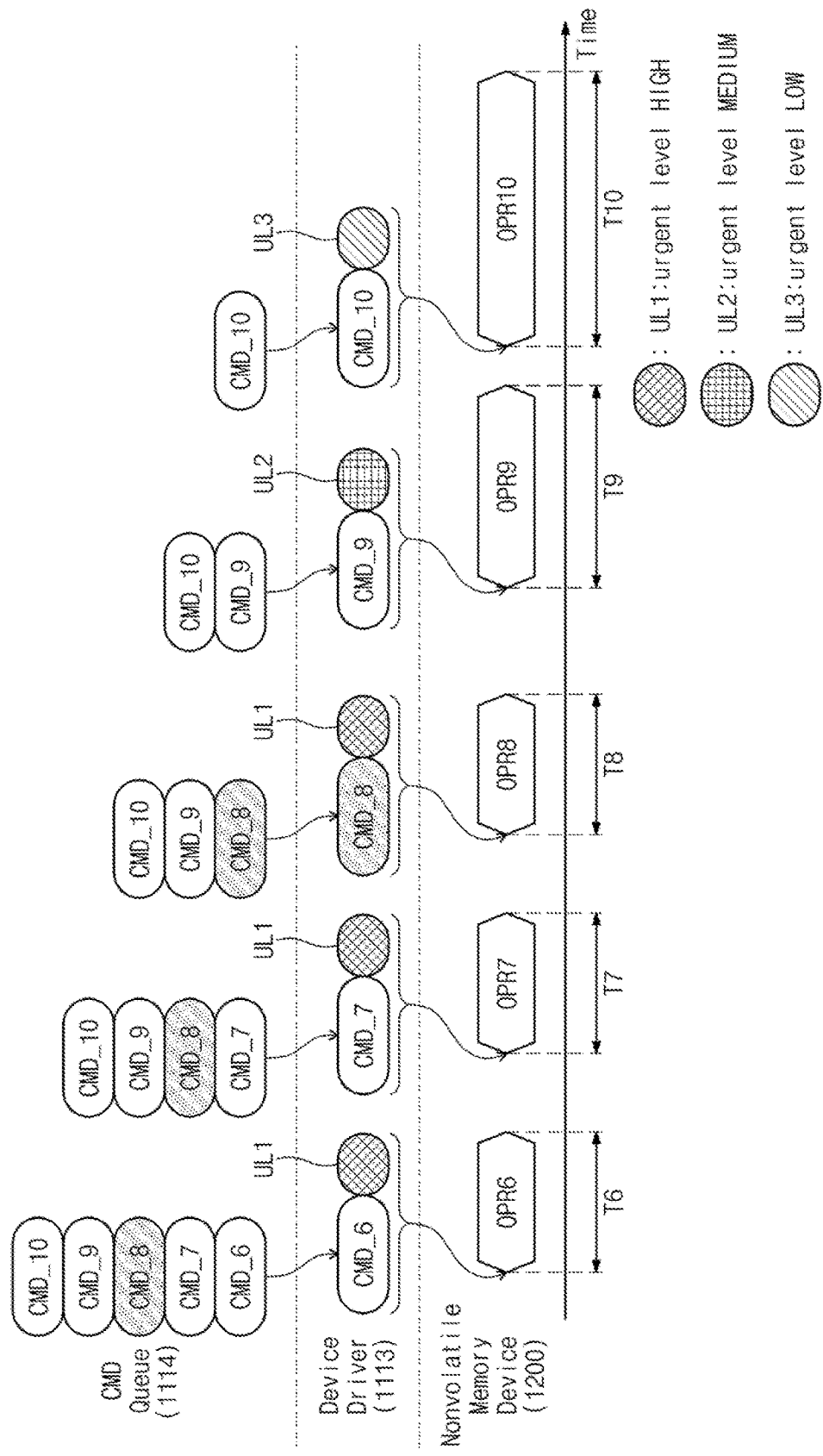
Figure 8:
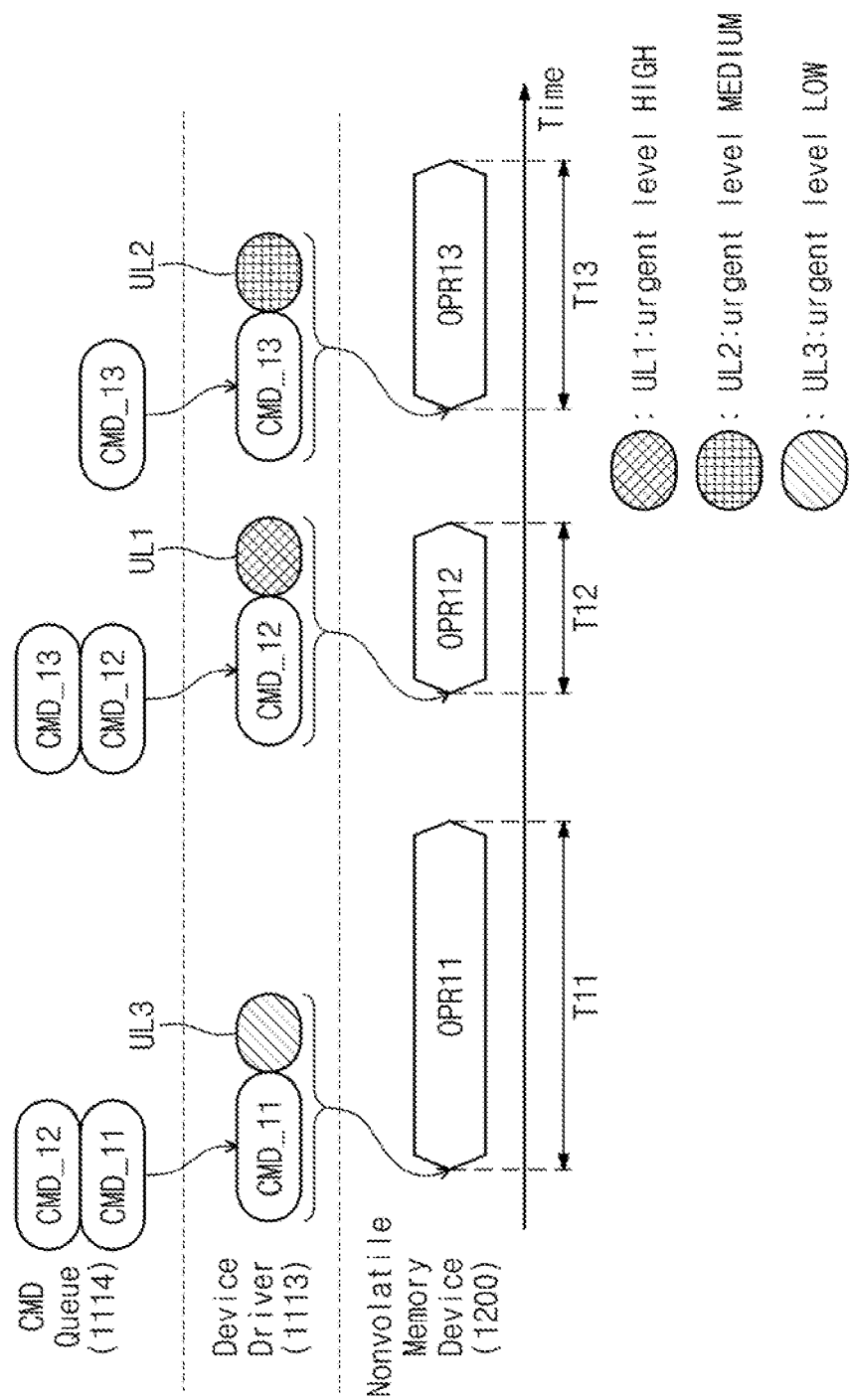

FIGS. 6 through 8 are timing diagrams that illustrate operations of the user system of FIG. 1. An embodiment of a user system that sets an urgency level UL based on the number of pending commands is described with reference to FIG. 6. An embodiment of a user system that sets an urgency level UL based on the number of priority commands is described with reference to FIG. 7. An embodiment of a user system that sets an urgency level UL based on the pending time of a command is described with reference to FIG. 8. However, embodiments of the inventive concept are not limited thereto and a user system in accordance with an embodiment of the inventive concept may set an urgency level UL by combining conditions, i.e., the number of pending commands, pending time, and the number of priority commands, illustrated in FIGS. 6 through 8.

For brevity of description, unless otherwise defined, it is assumed that the command CMD is a write command and the nonvolatile memory system 1200 performs a write operation in response to the command CMD and performs garbage collection to free a block during the write operation. It is also assumed that the nonvolatile memory system 1200 adjusts the operation time of an operation corresponding to the command by adjusting the performance time of the garbage collection. The number of commands, pending time and operation time that are being referenced below are illustrative and non-limiting.

However, embodiments of the inventive concept are not limited thereto. For example, the nonvolatile memory system 1200 may reduce operation time by changing a write mode, such as SLC mode, MLC mode, etc. For example, if a received command is a write command and an urgency level UL is HIGH, the nonvolatile memory system 1200 can temporarily store data DATA from the host 1100 in a write buffer. After that, the nonvolatile memory system 1200 transmits a complete response to the host 1100 and may transmit the data stored in the write buffer into the nonvolatile memory device 1220. That is, if an urgency level UL is high, the nonvolatile memory system 1200 can temporarily store data in a buffer memory to reduce latency with respect to the received command.

Referring to FIGS. 4 and 6, the command queue 1114 includes first through fifth commands CMD_1~CMD_5. The first through fifth commands CMD_1_~CMD_5 may be commands for performing a write operation requested by the processor 1110 or various application programs, etc. According to the order of the first through fifth commands CMD_1~CMD_5 in the command queue 1114, the device driver 1113 transmits the first command CMD_1 to the nonvolatile memory system 1200. At this time, the pending commands are the second through fifth commands CMD_2~CMD_5. The device driver 1113 sets an urgency level UL to be a first level UL1, i.e., HIGH. That is, as described above with reference to Table 1, since the number of pending commands is greater than a first critical value, such as 3, the device driver 1113 sets an urgency level UL to be HIGH. The device driver 1113 transmits information about the first level UL1 and the first command CMD_1 to the nonvolatile memory system 1200. The nonvolatile memory system 1200 sets an operation time of the first command CMD_1 to be a first time T1 based on the first level UL1. The nonvolatile memory system 1200 completes a first operation OPR1 corresponding to the first command CMD1 within the first time T1.

After the first operation OPR1 is completed, the device driver 1113 transmits the second command CMD_2 to the nonvolatile memory system 1200, based on the order of the commands in the command queue 1114. At this time, the pending commands are the third through fifth commands CMD_3~CMD_5. Similarly, the device driver 1113 sets an urgency level UL to the first level UL1, i.e., HIGH. The device driver 1113 transmits information on the first level UL1 and the second command CMD_2 to the nonvolatile memory system 1200. The nonvolatile memory system 1200 sets an operation time of the second command CMD_2 to be a second time T2 based on the first level UL1. The nonvolatile memory system 1200 completes a second operation OPR2 corresponding to the first command CMD_1 within the second time T2.

After the second operation OPR2 is completed, the device driver 1113 transmits the third command CMD_3 to the nonvolatile memory system 1200 based on the order of commands in the command queue 1114. At this time, since the pending commands are the fourth and fifth commands CMD_4 and CMD_5, the device driver 1113 sets an urgency level UL to be a second level UL2, i.e., MEDIUM. The device driver 1113 transmits information about the second level UL2 and the third command CMD_3 to the nonvolatile memory system 1200. The nonvolatile memory system 1200 sets an operation time of the third command CMD_3 to be a third time T3 based on the second level UL2. The nonvolatile memory system 1200 completes a third operation OPR3 of the third command CMD_3 within the third time T3.

After the second operation OPR3 is completed, the device driver 1113 transmits the fourth command CMD_4 to the nonvolatile memory system 1200 based on the order of commands in the command queue 1114. At this time, since pending command is the fifth command CMD_5, the device driver 1113 sets an urgency level UL to be the second level UL2, i.e., MEDIUM. The device driver 1113 transmits information about the second level UL2 and the fourth command CMD_4 to the nonvolatile memory system 1200. The nonvolatile memory system 1200 sets an operation time of the fourth command CMD_4 to be a fourth time T4 based on the second level UL2. The nonvolatile memory system 1200 completes a fourth operation OPR4 of the fourth command CMD_4 within the fourth time T4.

After the fourth operation OPR4 is completed, the device driver 1113 transmits the fifth command CMD_5 to the nonvolatile memory system 1200 based on the order of commands in the command queue 1114. At this time, since there is no pending command, the device driver 1113 sets an urgency level UL to be a third level UL3, i.e., LOW. The device driver 1113 transmits information about the third level UL3 and the fifth command CMD_5 to the nonvolatile memory system 1200. The nonvolatile memory system 1200 sets an operation time of the fifth command CMD_5 to be a fifth time T5 based on the third level UL3. The nonvolatile memory system 1200 completes a fifth operation OPR5 of the fifth command CMD_5 within the fifth time T5.

In example embodiments, the first and second times T1 and T2 are shorter than the third through fifth times T3, T4 and T5. The third and fourth times T3 and T4 are shorter than the fifth time T5. Each time when one of the first through fifth operations OPR1~OPR5 is completed, the nonvolatile memory system 1200 transmits a complete response to the host 1100. The host 1100 transmits a next command to the nonvolatile memory system 1200 based on the order of the command queue 1114, in response to the complete response.

As described above, the host 1100 can determine an urgency level UL based on the number of pending commands and transmit the determined urgency level UL to the nonvolatile memory system 1200. The nonvolatile memory system 1200 adjusts an operation time of an operation corresponding to a command CMD based the urgency level UL. The nonvolatile memory system 1200 can improve a command processing speed by reducing an operation time, or a garbage collection performance time, or a garbage collection operation stage, when an urgency level UL is HIGH. The nonvolatile memory system may perform garbage collection during an idle time or when an urgency level UL is LOW to free a sufficient block.

Referring to FIGS. 4 and 7, the command queue 1114 includes sixth through tenth commands CMD_6~CMD_10. The eighth command CMD_8 may be a read command having a high priority. The device driver 1113 sequentially transmits the sixth through tenth commands CMD_6~CMD_10 to the nonvolatile memory system 1200 based on the order of commands in the command queue 1114. At this time, since the eighth command CMD_8 has a high priority, when transmitting the sixth through eighth commands CMD_6~CMD_8, the device driver 1113 sets an urgency level UL to be the first level UL1 and transmits them to the nonvolatile memory system 1200. Accordingly, the nonvolatile memory system 1200 sets operation times of the sixth through eighth commands CMD_6~CMD_8 to be sixth through eighth times T6, T7 and T8 respectively. The nonvolatile memory system 1200 performs a sixth operation OPR6 within the sixth time T6, performs a seventh operation OPR7 within the seventh time T7, and performs an eighth operation OPR8 within the eighth time T8. An urgency level UL with respect to the ninth and tenth commands CMD_9 and CMD_10 and an operation thereof are similar to those of the fourth and fifth commands CMD_4 and CMD_5, a further description thereof is omitted.

As described above, if there is a command having a high priority among the pending commands, the device driver 1113 can set an urgency level UL to be high. The nonvolatile memory system 1200 can reduce performance times of operations of a command in response to a high urgency level UL.

Referring to FIGS. 4 and 8, the command queue 1114 includes eleventh and twelfth commands CMD_11 and CMD_12. The device driver 1113 transmits the eleventh command CMD_11 to the nonvolatile memory system 1200. At this time, the device driver 1113 sets an urgency level UL to be the third level UL3 and transmits it to the nonvolatile memory system 1200. The nonvolatile memory system 1200 sets an operation time of the eleventh command CMD_11 to be an eleventh time T11 based on the third level UL3. The nonvolatile memory system 1200 can complete an eleventh operation OPR11 of the eleventh command CMD_11 within the eleventh time T11.

After the eleventh operation OPR11 is completed, the device driver 1113 transmits the twelfth command CMD_12 to the nonvolatile memory system 1200. A pending time of the twelfth command CMD_12 may be greater than a first critical time (t1) (refer to Table 1). The pending time refers to a time duration for which a command has been pending in the command queue 1114. For example, as an operation time of the eleventh operation OPR11 of the eleventh command CMD_11 increases, a pending time of the twelfth command CMD_12 may increase. At this time, the pending time of the twelfth command CMD_12 may be greater than the first critical time (t1). In this case, the device driver 1113 sets an urgency level UL to be the first level UL1, i.e., HIGH, and transmits the twelfth command CMD_12 and the first level UL1 to the nonvolatile memory system 1200. The nonvolatile memory system 1200 sets an operation time of an operation of the twelfth command CMD_12 to be a twelfth time T12 based on the first level UL1. The nonvolatile memory system 1200 can complete a twelfth operation OPR12 within the twelfth time T12.

A thirteenth command CMD_13 may be input to the command queue 1114 by a request of the processor 1110 while the eleventh operation OPR11 is performed. After the twelfth operation OPR12 is completed, the device driver 1113 transmits the thirteenth command CMD_13 to the nonvolatile memory system 1200. Since the thirteenth command CMD_13 was input to the command queue 1114 while the eleventh operation OPR11 was being performed, a pending time of the thirteenth command CMD_13 may be shorter than the first critical time (pt1) and longer than a second critical time (pt2) (refer to Table 1). In this case, the device driver 1113 sets an operation time of an operation of the thirteenth command CMD_13 to be a thirteenth time T13 and completes a thirteenth operation OPR13 within the thirteenth time T13.

As described above, the host 1100 sets an urgency level UL based on the number of pending commands, the pending time and the priority of the pending commands and transmits the urgency level UL to the nonvolatile memory system 1200. The nonvolatile memory system 1200 adjusts an operation time of an operation of the received command CMD based on the urgency level UL. The nonvolatile memory system 1200 adjusts performance time or operation stage of garbage collection based on the urgency level UL. Thus, performance of a nonvolatile memory system can be improved.

Figure 9:
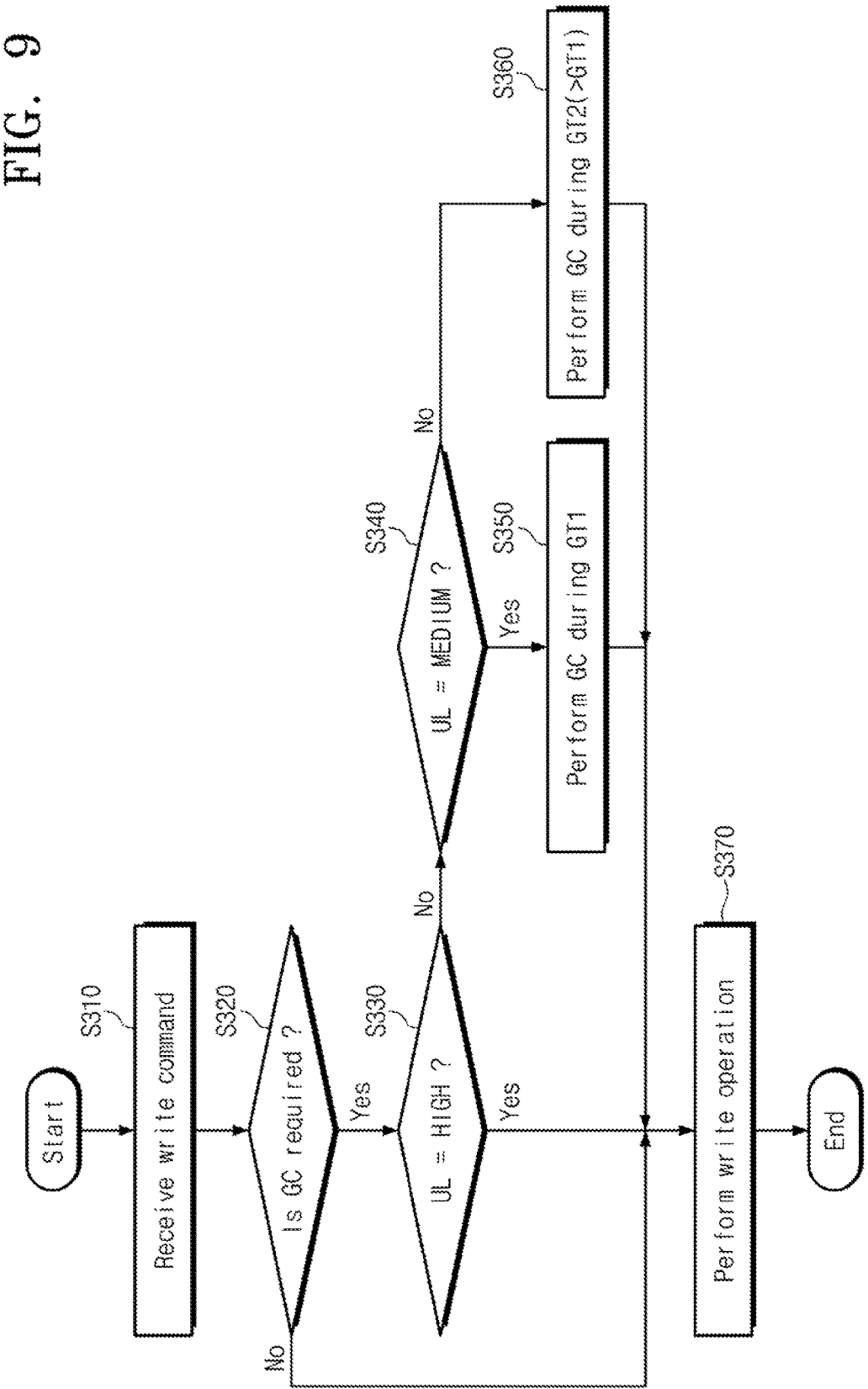
FIG. 9 is another flowchart of an operation of the nonvolatile memory system of FIG. 1.

FIG. 9 is flowchart of an operation of the nonvolatile memory system of FIG. 1, according to an embodiment of the inventive concept. A write operation and garbage collection of the nonvolatile memory system 1200 are described with reference to FIG. 9. However, embodiments of the inventive concept are not limited thereto, and the method of FIG. 9 is applicable to other commands received from the host and other memory management commands performed by the nonvolatile memory system. Referring to FIGS. 1 and 9, in step S310, the nonvolatile memory system 1200 receives a write command from the host 1100 that includes an urgency level UL. For example, the host 1100 determines an urgency level UL based on the method described with reference to FIGS. 1 through 8 and transmits the urgency level UL to the nonvolatile memory system 1200 together with the write command.

In step S320, the nonvolatile memory system 1200 determines whether garbage collection is required. For example, the nonvolatile memory system 1200 determines whether the number of free memory blocks is less than a predetermined number. If the number of free memory blocks is less than the predetermined number, the nonvolatile memory system 1200 determines that garbage collection is required. If the number of free memory blocks is greater than the predetermined number, the nonvolatile memory system 1200 determines that no garbage collection is required.

If garbage collection is not required, in step S370, the nonvolatile memory system 1200 performs a write operation of the write command.

If garbage collection is required, in step S330, the nonvolatile memory system 1200 determines whether the urgency level UL is HIGH. For example, if the urgency level UL is HIGH, the nonvolatile memory system 1200 performs an operation of step S370. In this case, the nonvolatile memory system 1200 does not perform garbage collection.

If the urgency level UL is not HIGH, in step S340, the nonvolatile memory system 1200 determines whether the urgency level UL is MEDIUM. If the urgency level UL is MEDIUM, in step S350, the nonvolatile memory system 1200 performs garbage collection during a first time GT1. If the urgency level UL is not MEDIUM, that is, the urgency level UL is LOW, in step S360, the nonvolatile memory system 1200 performs garbage collection during a second time GT2, where the second time GT2 is longer than the first time GT1.

After step S350 or step S360, the nonvolatile memory system 1200 performs step S370.

As described above, the nonvolatile memory system 1200 can adjust a garbage collection time based on an urgency level UL received from the host 1100. Accordingly, an operation time of a command CMD can be adjusted.

An embodiment as described above is example and illustrative and embodiments of the inventive concept are not limited thereto. For example, the urgency level UL can be subdivided into other levels besides HIGH, MEDIUM and LOW. In addition, if the number of free memory blocks is less than a specific number, the nonvolatile memory system 1200 can perform garbage collection independent of the urgency level UL.

In example embodiments, the nonvolatile memory system 1200 can adjust an operation stage of garbage collection based on the urgency level UL. For example, garbage collection can include operation stages such as victim block selection, valid page search, target block selection, valid page movement, and victim block delete. The valid page movement can be performed by repeatedly performing read and write operations in page units. The nonvolatile memory system 1200 can perform parts of the garbage collection operation stages described above based on the urgency level UL. If the urgency level UL is LOW, garbage collection stages can be performed more often than if the urgency level UL is MEDIUM or HIGH.

In example embodiments, while garbage collection and write operations were described with reference to FIG. 9, inventive concepts of example embodiments can applied to a read operation and a read reclaim operation.

Figure 10:
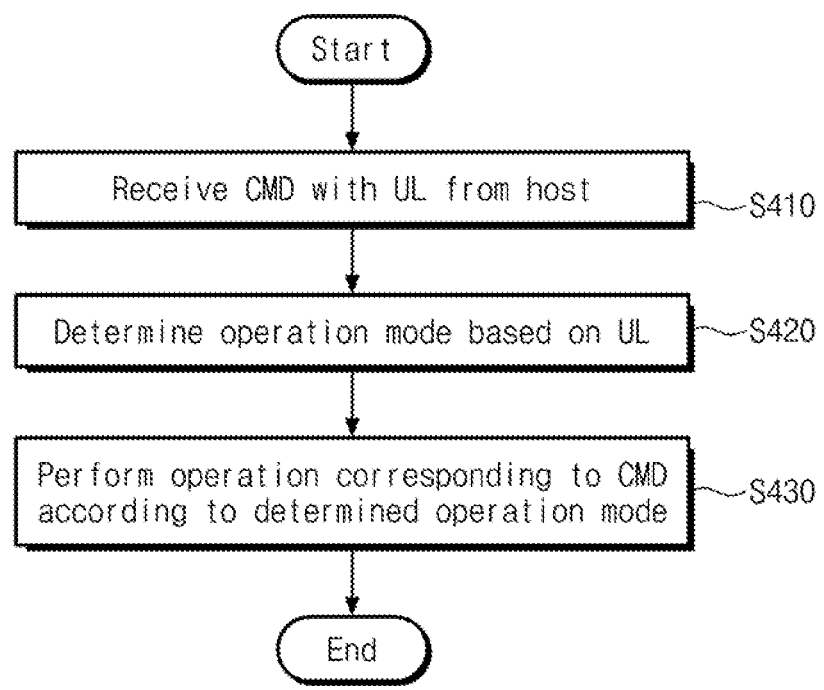
FIG. 10 is a flowchart of a user system in accordance with another embodiment of the inventive concept.

FIG. 10 is a flowchart of a user system in accordance with an embodiment of the inventive concept. Referring to FIGS. 1 and 10, in step S410, the nonvolatile memory system 1200 receives a command CMD from the host 1100 that includes an urgency level UL. Since an operation of step S410 is the same as that of step S210 of FIG. 5, a further detailed description thereof is omitted.

In step S420, the nonvolatile memory system 1200 selects an operation mode from a plurality of operation modes based on an urgency level UL. For example, the nonvolatile memory system 1200 operates based on the operation modes. The operation modes have different operating conditions from each other. Operating conditions includes conditions such as the limit of the number of write operations or read operations, a garbage collection trigger condition, a write speed, a read speed, etc.

More specifically, as described with reference to Table 1, if an urgency level UL is HIGH, the nonvolatile memory system 1200 selects an urgent operation mode, if an urgency level UL is MEDIUM, the nonvolatile memory system 1200 selects a medium operation mode, and if an urgency level UL is LOW, the nonvolatile memory system 1200 selects a normal operation mode.

In example embodiments, the urgent operation mode is an operation mode in which the number of write operations or read operations is limited to N, where N is an integer equal to or greater than 0, for an operation of a command CMD. The medium operation mode is an operation mode in which the number of write operations or read operations is limited to M, where M is an integer greater than N, for an operation of a command CMD. The normal operation mode is an operation mode in which the number of write operations or read operations is limited to K, where K is an integer greater than M, or an operation mode in which the number of write operations or read operations is not limited, for an operation of a command CMD. The read operation is an operation in which the memory controller 1210 reads data or information from the nonvolatile memory device 1220 and is performed in page units. The write operation is an operation in which the memory controller 1210 writes data or information to the nonvolatile memory device 1220 and is performed in page units. That is, a read operation is a read operation of one page and a write operation is a write operation of one page.

In step S430, the nonvolatile memory system 1200 performs an operation of the received command CMD based on the selected operation mode. For example, the received command CMD may be a write command. The nonvolatile memory system 1200 performs a write operation of the received command CMD. Garbage collection can be performed while the nonvolatile memory system 1200 performs a write operation of the received command CMD. If the nonvolatile memory system 1200 performs garbage collection, a write operation and a read operation may be repeatedly performed. At this time, the nonvolatile memory system 1200 can adjust performance time of the garbage collection by limiting the number of write operations or the number of read operations based on the selected operation mode.

As described above, if an urgency level UL is high, by limiting the number of write operations or read operations while an operation of a command CMD is being performed, the garbage collection performance time can be reduced and the operation of the command CMD can be more rapidly performed.

In an above-described embodiment, while operation modes are described based on a limited number of write operations or read operations, embodiments of the inventive concept are not limited thereto. For example, the operation modes may include different garbage collection trigger conditions, different write operation modes, such as SLC write, MLC write, etc, or different read operation modes.

If the nonvolatile memory system 1200 operates in an urgent operation mode, a critical value for a garbage collection trigger condition may be set to be "a". If the nonvolatile memory system 1200 operates in a medium operation mode, a critical value for a garbage collection trigger condition may be set to be "b". At this time, "a" is less than "b". Similarly, if the nonvolatile memory system 1200 operates in a normal operation mode, a critical value for a garbage collection trigger condition may be set to be "c". At this time, "c" is greater than "b". That is, as garbage collection trigger condition decreases, a frequency of performing garbage collection decreases. In other words, the nonvolatile memory system 1200, may reduce an operation time if an urgency level UL is high by adjusting a garbage collection trigger condition, i.e., the critical value, based on an operation mode.

Figure 11:
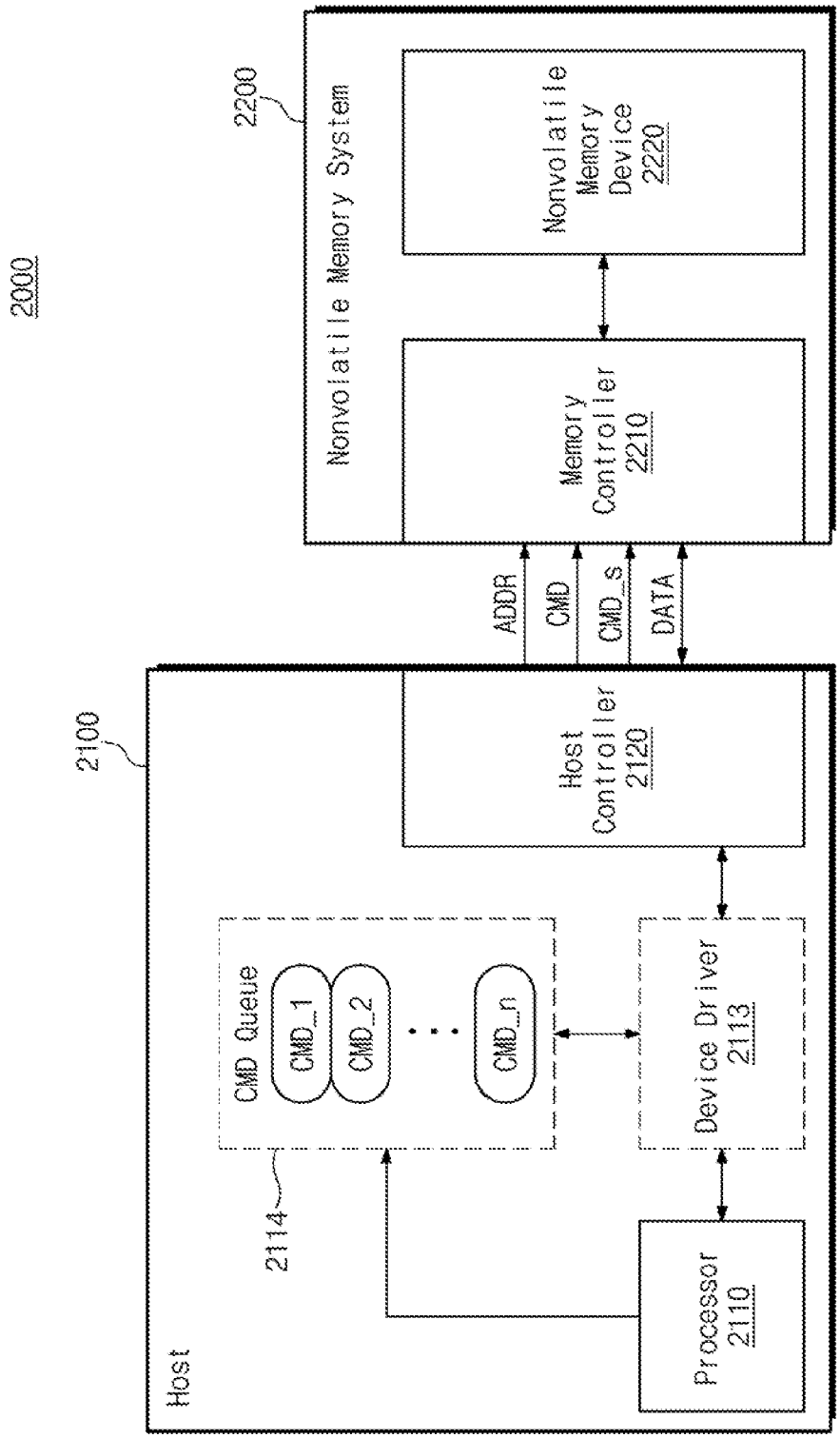
FIG. 11 is a block diagram that illustrates a user system in accordance with another embodiment of the inventive concept.

FIG. 11 is a block diagram that illustrates a user system in accordance with another embodiment of the inventive concept. Referring to FIG. 11, a user system 2000 includes a host 2100 and a nonvolatile memory system 2200. The host 2100 includes a processor 2110, a device driver 2113, a command queue 2114 and a host controller 2120. The nonvolatile memory system 2200 includes a memory controller 2210 and a nonvolatile memory device 2220. Since the host 2100, the processor 2110, the device driver 2113, the command queue 2114, the host controller 2120, the nonvolatile memory system 2200, the memory controller 2210 and the nonvolatile memory device 2220 were described with reference to FIGS. 1 and 4, a further detailed description thereof is omitted.

The host 1100 of FIG. 1 includes an urgency level UL in a command CMD to be transmitted to the nonvolatile memory system 1200, but the host 2110 of FIG. 11 transmits information about an urgency level UL to the nonvolatile memory system 2200 using a separate state command CMD_s. According to an embodiment, the state command CMD_s includes at least one of a command separately defined for transmitting an urgency level UL, a reserved command, a vendor command, or a combination of commands defined by an interface between the host 2100 and the nonvolatile memory system 2200.

As described with reference to FIGS. 1 through 8, the host 2100 determines an urgency level UL based on pending commands. If an urgency level UL changes, the host 2100 transmits a state command CMD_s including information of the changed urgency level UL to the nonvolatile memory system 2200, and the nonvolatile memory system 2200 adjusts an operation time of an operation being performed based on the urgency level UL in the state command CMD_s.

For example, the host 2100 transmits a write command to the nonvolatile memory system 2200. The nonvolatile memory system 2200 receives the write command and performs a write operation in response to the write command. While the nonvolatile memory system 2200 performs the write operation, additional commands may be input to the command queue 2114 by the processor 2110 of the host 2100. As the number of commands in the command queue 2114 increases, an urgency level UL may be changed to be HIGH. The host 2100 transmits a state command CMD_s that includes information about the changed urgency level UL to the nonvolatile memory system 2200.

The nonvolatile memory system 2200 adjusts an operation time of an operation being performed based on the received state command CMD_s. For example, the nonvolatile memory system 2200 can perform garbage collection to free a block while performing a write operation in response to a write command. The nonvolatile memory system 2200 can stop garbage collection from being performed or reduce a performance time of the garbage collection being performed to complete a write operation in response to the state command CMD_s. After the write operation has completed, the host 2100 can perform a next operation based on the order of commands in the command queue 2114.

As described above, the host 2100 determines an urgency level UL based on the number of pending commands and if an urgency level UL changes, can transmit a state command CMD_s to the nonvolatile memory system 2200. The nonvolatile memory system 2200 adjusts an operation time of an operation being performed in response to the received state command CMD_s and can complete the operation being performed within the adjusted operation time.

FIG. 11 was described with reference to the urgency level UL changing depending on the number of pending commands. However, embodiments of the inventive concept are not limited thereto and the urgency level UL may be changed based on a pending time of command, the number of priority order commands, etc.

The nonvolatile memory system 2200 receives a state command CMD_s including the changed urgency level UL and as described with reference to FIG. 10, may select any one of a plurality of operation modes according to the received urgency level UL. The nonvolatile memory system 2200 may operate based on the selected operation mode.

Figure 12:
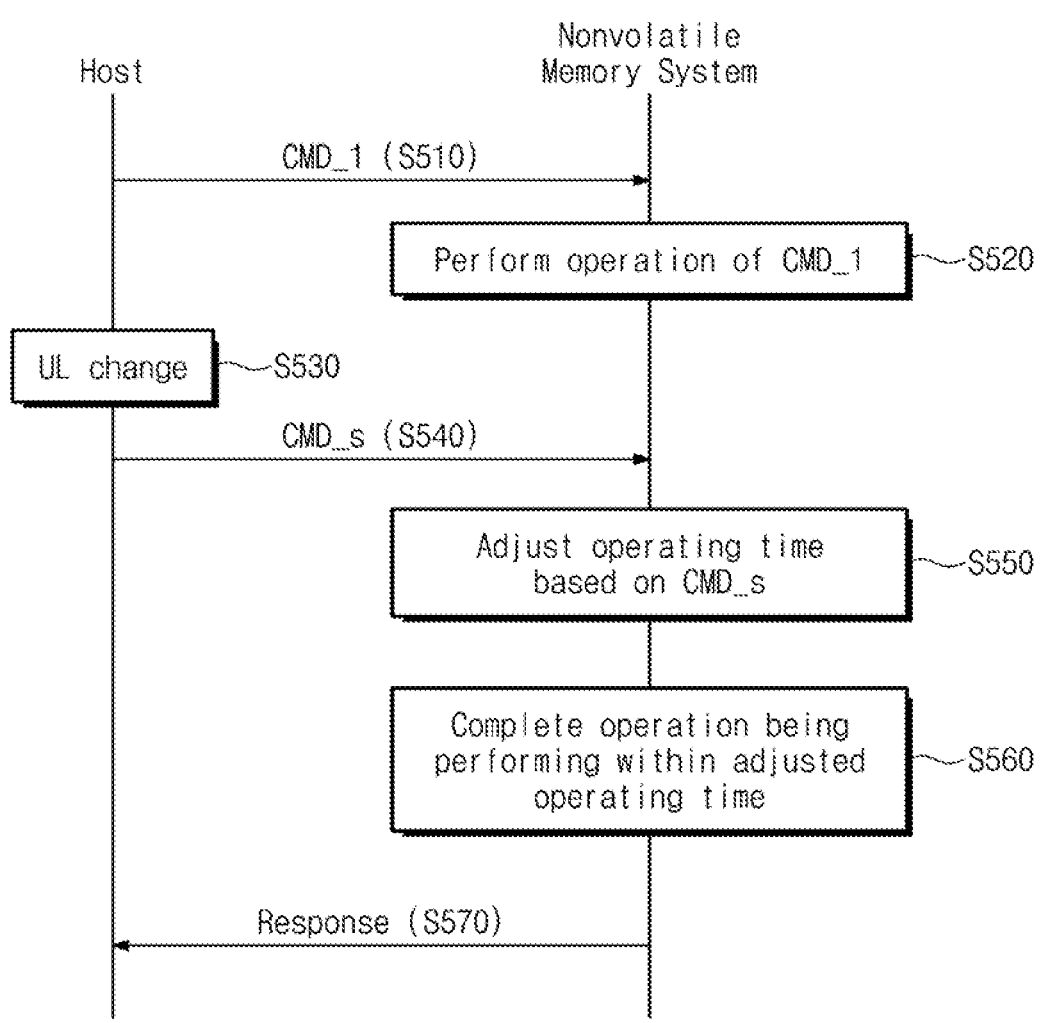
FIG. 12 is a flowchart that illustrates an operation of the user system of FIG. 11.

FIG. 12 is a flow chart that illustrates an operation of the user system of FIG. 11. Referring to FIGS. 11 and 12, in step S510, the host 2100 transmits a first command CMD_1 to the nonvolatile memory system 2200. The first command CMD_1 may be a write command defined by an interface between the host 2100 and the nonvolatile memory system 2200.

In step S520, the nonvolatile memory system 2200 performs an operation of the received first command CMD_1. For example, the nonvolatile memory system 2200 can perform garbage collection to free a block for a write operation in response to the first command CMD1.

In step S530, the host 2100 changes an urgency level UL. For example, as described above with reference to FIGS. 1 through 10, the host 2100 can determine an urgency level UL based on a pending command. At this time, while the nonvolatile memory system 2200 performs an operation of the first command CMD_1, if a pending time of a pending command CMD exceeds a critical time, the number of pending commands exceeds a critical value or a command having priority is received by a command queue, the nonvolatile memory system 2200 changes an urgency level UL. That is, the urgency level UL can be changed to be HIGH.

In a step S540, the host 2100 transmits a state command CMD_s to the nonvolatile memory system 2200. The state command CMD_s includes information about the changed urgency level UL. The state command CMD_s may include at least one of a reserved command, a vendor command, a combination of commands, and commands separately defined to transmit an urgency level UL.

In step S550, the nonvolatile memory system 2200 adjusts an operation time based on the state command CMD_s. For example, if the urgency level UL in the state command CMD_s is HIGH, the nonvolatile memory system 2200 adjusts an operation time for completing an operation being performed as soon as possible. For example, if the nonvolatile memory system 2200 is performing garbage collection, it can adjust an operation time to stop performance of the garbage collection and perform a write operation.

In step S560, the nonvolatile memory system 2200 completes an operation being performed within the adjusted operation time. For example, the nonvolatile memory system 2200 performs garbage collection to free a block during a write operation. The nonvolatile memory system 2200 completes a write operation within the adjusted operation time by stopping or minimizing the garbage collection being performed to perform the write operation.

In step S570, the nonvolatile memory system 2200 transmits a completion response for the write operation to the host 2100.

Although not illustrated in the drawing, after the step S570, the host 2100 may perform an operation for processing a next command according to the order of commands included in the command queue.

The nonvolatile memory system 2200, as described with reference to FIG. 10, may adjust an operation time of an operation corresponding to the first command CMD_1 by selecting any one of a plurality of operation modes on the basis of a state command CMD_s or an urgency level UL to operate according to the selected operation mode.

Figure 13:
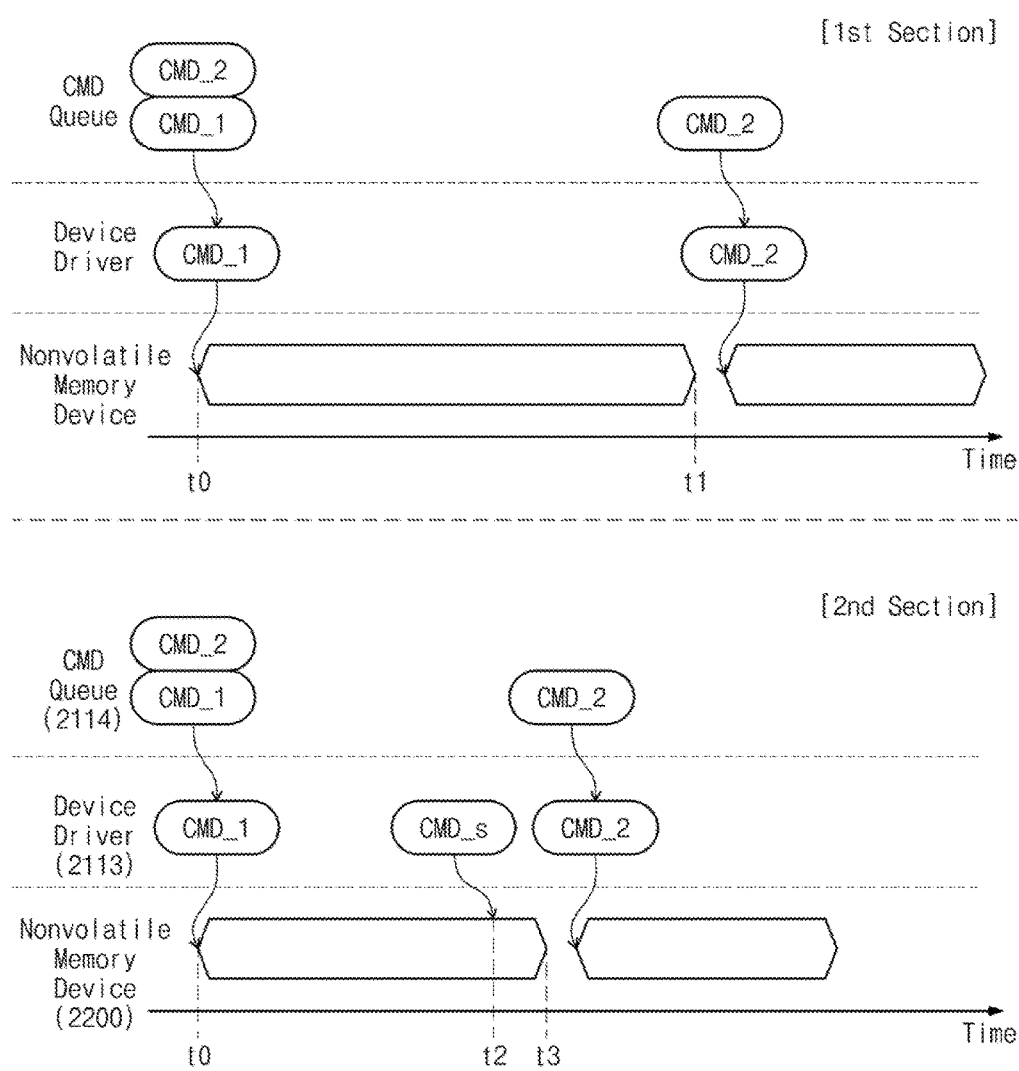
FIGS. 13 and 14 are timing diagrams that illustrate an operation of the user system of FIG. 11.
Figure 14:
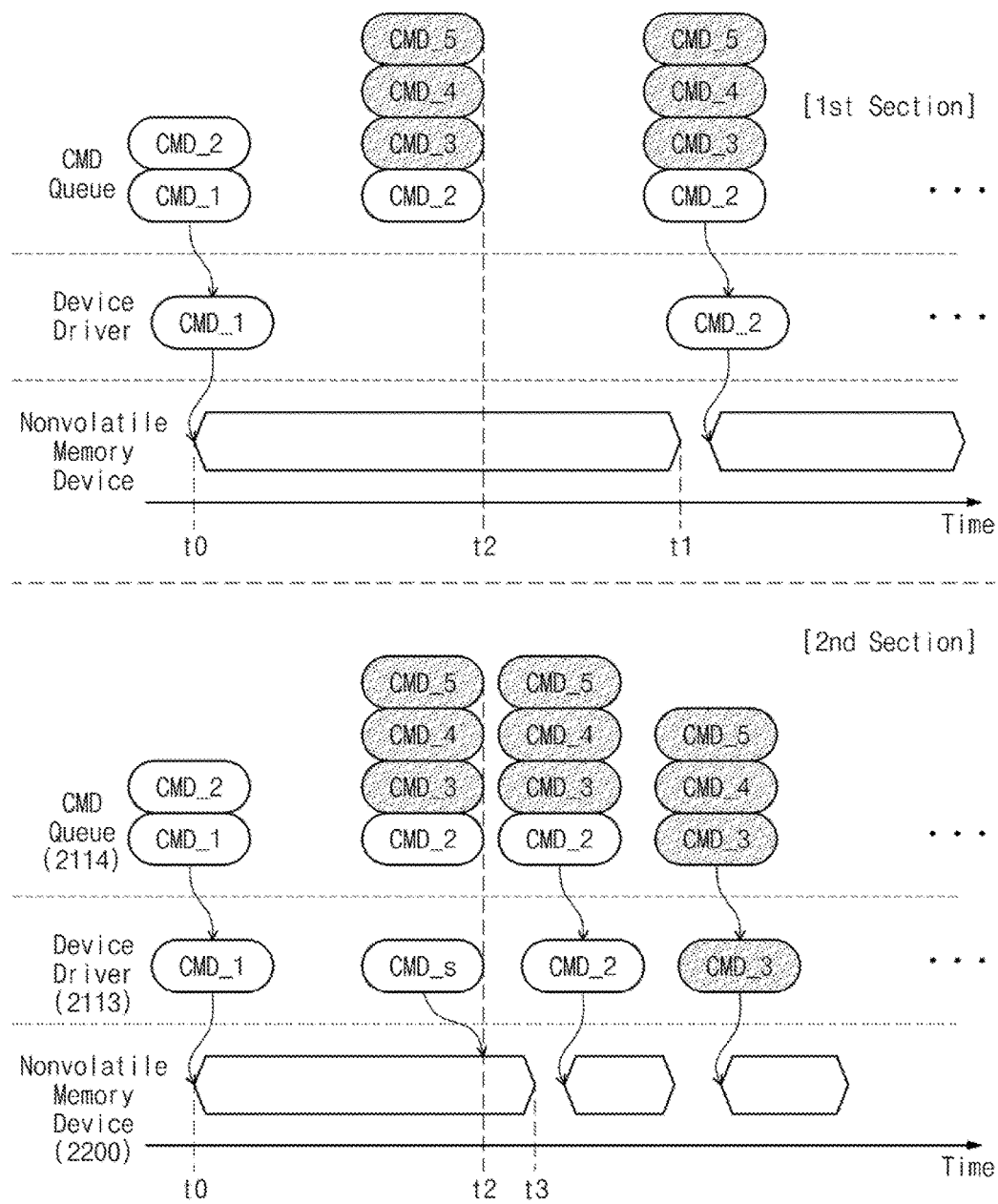

FIGS. 13 and 14 are timing diagrams that illustrate an operation of the user system of FIG. 11. The first sections of FIGS. 13 and 14 illustrate an operation of a user system according to a conventional art and the second sections of FIGS. 13 and 14 illustrate an operation of a user system 2000 according to example embodiments of the inventive concept.

First, referring to FIGS. 11 through 13, the command queue 2114 includes first and second commands CMD_1 and CMD_2. As illustrated in the first section of FIG. 13, a conventional device driver transmits the first command CMD_1 to a nonvolatile memory system based on the order of commands included in the command queue, and the nonvolatile memory device performs an operation of the received first command CMD1 until a first time (t1). At this time, a conventional nonvolatile memory system performs an operation of the first command CMD_1 without considering the second command CMD_2 pending in the host.

However, according to an embodiment, as illustrated in the second section of FIG. 13, the device driver 2114 transmits the first command CMD_1 to the nonvolatile memory system 2200. After that, at a second time (t2), a pending time of the second command CMD_2 in the command queue 2114 exceeds a critical value. In this case, at the second time (t2), the device driver 2113 changes an urgency level UL to be HIGH and transmits a state command CMD_s that includes information about the changed urgency level UL to the nonvolatile memory system 2200, which is performing an operation for the first command CMD_1. The nonvolatile memory system 2200 completes the operation of the first command CMD_1 being performed within a third time (t3) in response to the state command CMD_s. The second time (t2) and the third time (t3) are both less than the first time (t1). After that, the device driver 2113 transmits the second command CMD_2 to the nonvolatile memory system 2200, and the nonvolatile memory system 2200 performs an operation of the second command CMD_2.

Referring to FIGS. 11, 12 and 14, the command queue 2114 includes the first and second commands CMD_1 and CMD_2. At the second time (t2), third through fifth commands are input to the command queue 2114 by a request of an application or a user. As illustrated in the first section of FIG. 14, since a conventional nonvolatile memory system does not consider pending commands, although the number of pending commands has increased, an operation of the first command is performed until the first time (t1).

However, according to an embodiment, as illustrated in the second section of FIG. 14, the device driver 2113 changes an urgency level UL to HIGH at the second time (t2) at which the third through fifth commands CMD_3~CMD_5 are received. At the second time (t2), the device driver 2113 transmit a state command CMD_s with the changed urgency level to the nonvolatile memory system 2200. The nonvolatile memory system 2200 completes an operation of the first command CMD_1 within the third time (t3) based on the state command CMD_s.

A method of reducing an operation time in response to the state command CMD_s can include methods such as reducing garbage collection performance time and changing a write mode. While an urgency level UL is LOW, the nonvolatile memory system 2200 can be idle or perform garbage collection to free a predetermined block. Thus, even if, in response to the state command CMD_s, garbage collection is stopped or performance time of the garbage collection is reduced, the nonvolatile memory system 2200 can perform a write operation.

As illustrated in FIGS. 13 and 14, even if the pending time of commands in a host or the number of commands pending in the host increases, a conventional nonvolatile memory system performs an operation of a command without considering those conditions. However, a user system in accordance with example embodiments of the inventive concept can process many requests or many commands in a short time by determining an urgency level UL based on pending commands and adjusting an operation time of the nonvolatile memory system based on the urgency level UL. Thus, performance of a nonvolatile memory system can be improved.

Figure 15:
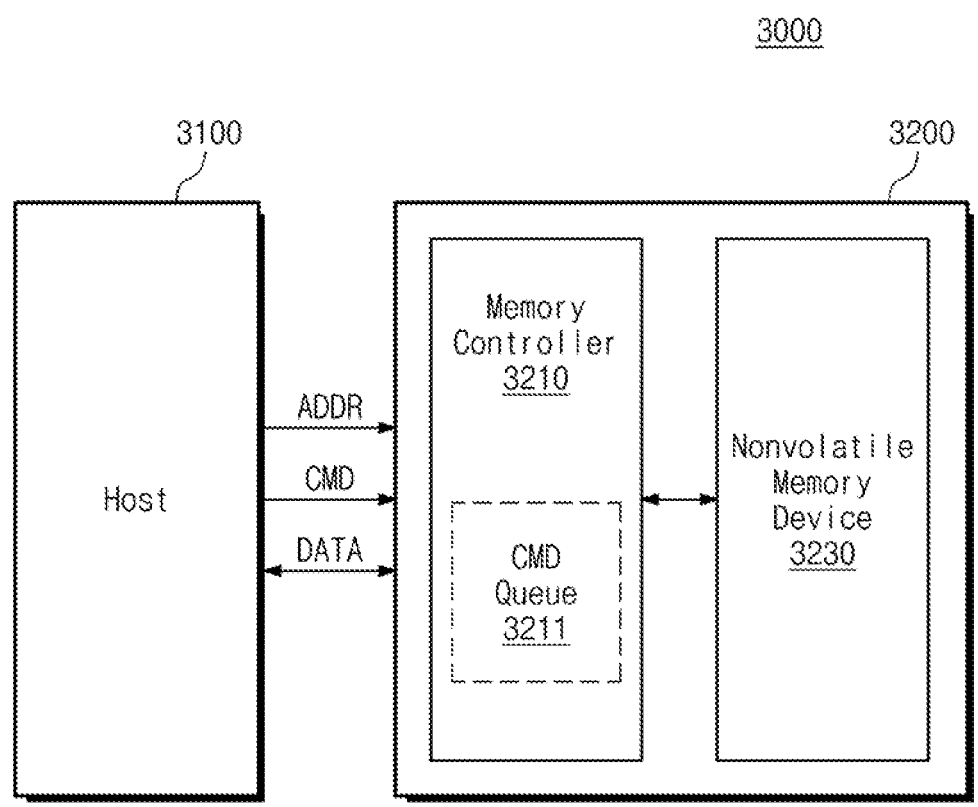
FIG. 15 is a block diagram of a user system in accordance with another embodiment of the inventive concept.

FIG. 15 is a block diagram of a user system in accordance with another embodiment of the inventive concept. Referring to FIG. 15, a user system 3000 includes a host 3100 and a nonvolatile memory system 3200. The host 3100 can transmit a command CMD, an address ADDR, and data DATA to the nonvolatile memory system 3200.

The nonvolatile memory system 3200 includes a memory controller 3210 and a nonvolatile memory device 3230. The nonvolatile memory system 3200 can write data or transmit stored data to the host 3100 in response to signals received from the host 3100. The memory controller 3210 can control the nonvolatile memory device 3230 in response to a command CMD received from the host 3100.

The host 3100 can transmit a plurality of commands CMD to the nonvolatile memory system 3200. The memory controller 3210 can sequentially perform the commands CMD received from the host 3100. The memory controller 3210 manages the commands CMD in a command queue 3211. The memory controller 3210, as described above with reference to FIGS. 1 through 14, determines an urgency level UL based on the pending commands and adjusts operation times of operations being performed or to be performed based on the urgency level UL.

Figure 16:
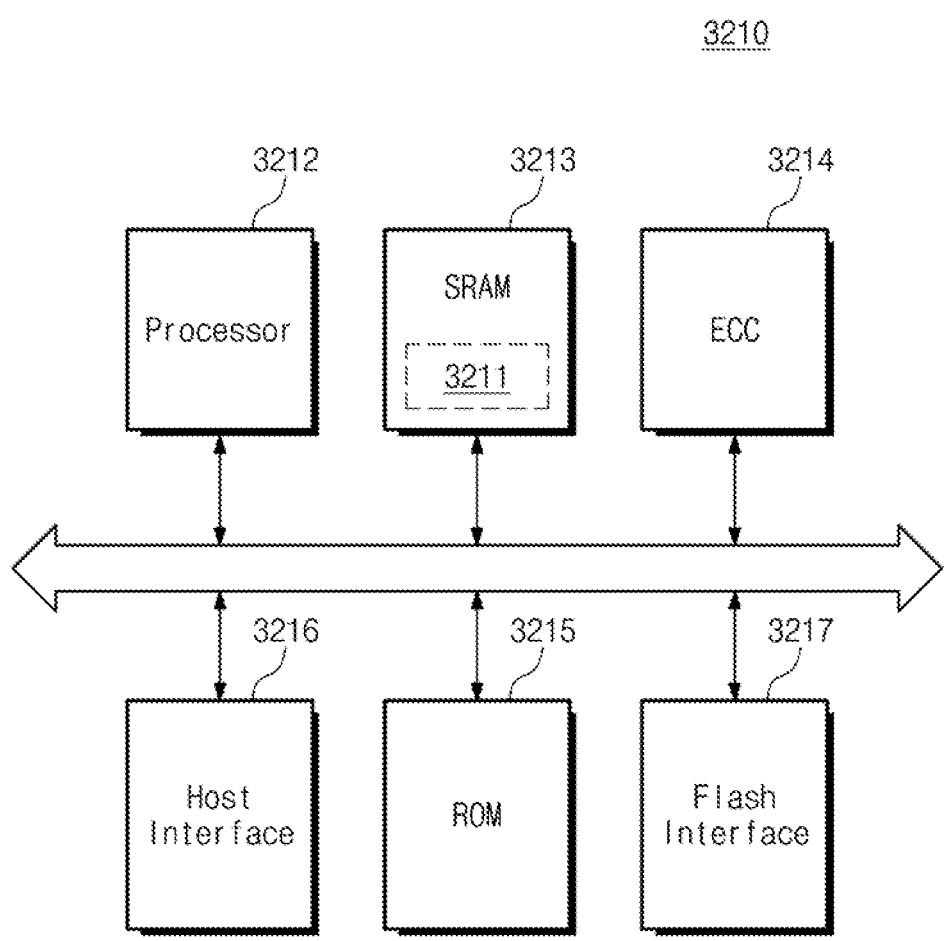
FIG. 16 is a block diagram of the memory controller of FIG. 15 in detail.

FIG. 16 is a block diagram of the memory controller of FIG. 15 in detail. Referring to FIGS. 15 and 16, the memory controller 3210 includes a processor 3212, an SRAM 3213, an ECC (error correction circuit) 3214, a ROM 3215, a host interface 3216 and a flash interface 3217.

The processor 3212 controls an overall operation of the memory controller 3210. The SRAM 3213 may be used as an operation memory, a main memory or a buffer memory of the memory controller 3210. The SRAM 3213 can store the command queue 3211 and a flash translation layer (FTL). The FTL stored in the SRAM 3213 is driven by the processor 3212 and the command queue 3211 is managed by the processor 3212.

The processor 3212 can determine an urgency level UL of a command being performed based on pending commands in the command queue 3211. Based on the result, an operation time of the command being performed can be adjusted.

The ECC (error correction circuit) 3214 can detect and correct an error in data read from the nonvolatile memory device 3220. The ROM 3215 can store in firmware a variety of information required for operations of the memory controller 3210.

The memory controller 3210 communicates with the host 3100 through the host interface 3216. The host interface 3216, as described above with reference to FIG. 1, includes at least one communications standard, such as a universal serial bus (USB), a multimedia card (MMC), a peripheral component interconnection (PCI), a PCI-express, an advanced technology attachment (ATA), a serial-ATA, a parallel-ATA, a small computer small interface (SCSI), an enhanced small disk interface (ESDI), an integrated drive electronics (IDE), a Firewire, a universal flash storage (UFS), a nonvolatile memory-express (NVM-e), etc.

The memory controller 3210 communicates with the nonvolatile memory system 3220 through the flash interface 3217. The flash interface 3217 may include a NAND interface.

According to embodiments of the inventive concept described above, the memory controller 3210 adjusts an operation time of a command being performed based on pending commands. Thus, a nonvolatile memory system can have improved performance.

Figure 17:
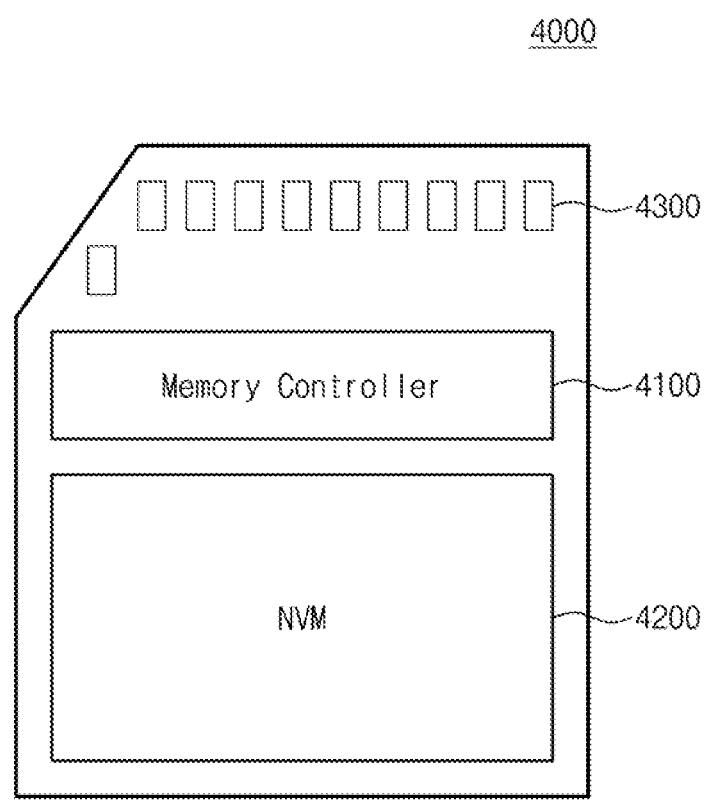
FIG. 17 is a block diagram of a memory card system that includes a nonvolatile memory system in accordance with example embodiments of the inventive concept.

FIG. 17 is a block diagram of a memory card system that includes a nonvolatile memory system in accordance with example embodiments of the inventive concept. Referring to FIG. 17, the memory card system 4000 includes a controller 4100, a nonvolatile memory 4200 and a connector 4300.

The controller 4100 is connected to the nonvolatile memory 4200. The controller 4100 is configured to access the nonvolatile memory 4200. For example, the controller 4100 is configured to control read, write, erase and background operations of the nonvolatile memory 4200. Background operations include operations such as wear volume management, garbage collection, etc. The controller 4100, as described above with reference to FIGS. 1 through 14, can receive an urgency level UL from a host, and based on the received urgency level UL, controls an operation time or garbage collection time of the nonvolatile memory 4200, or can select an operation mode.

The controller 4100, as described above with reference to FIGS. 15 and 16, can manage a plurality of commands in a command queue and can determine an urgency level UL based on the pending commands.

The controller 4100 can provide an interface between the nonvolatile memory 4200 and the host. The controller 4100 can execute firmware that controls the nonvolatile memory 4200.

According to embodiments, the controller 4100 includes constituent elements such as a RAM, a processing unit, a host interface, a memory interface, an error correction circuit or randomizer.

The controller 4100 communicates with the host through the connector 4300. The controller 4100 communicates with the host according to a specific communication standard. An urgency level UL from the host can be included in a reserved area of a command defined by at least one of the above-mentioned communication standards or can be provided to the controller 4100 through a reserved command, a vendor command, or combinations of commands.

According to embodiments, the nonvolatile memory 4200 can be embodied in various nonvolatile memory devices, such as an EEPROM (electrically erasable and programmable ROM), a NAND flash memory, a NOR flash memory, a PRAM (phase-change RAM), an ReRAM (resistive RAM), a FRAM (ferroelectric RAM), a STT-MRAM (spin-torque magnetic RAM), etc.

The controller 4100 and the nonvolatile memory 4200 may be integrated into one semiconductor device. The controller 4100 and the nonvolatile memory 4200 may be integrated into one semiconductor device to constitute an SSD (solid state drive).

The controller 4100 and the nonvolatile memory 4200 may be integrated into one semiconductor device to constitute a memory card. For example, the controller 4100 and the nonvolatile memory 4200 may be integrated in one semiconductor device to constitute a memory card, such as a personal computer memory card international association (PCMCIA) card, a compact flash (CF) card, a smart media card (SM, SMC), a memory stick, a multimedia card (MMC, RS-MMC, MMCmicro), a SD card (SD, miniSD, microSD, SDHC), a universal flash memory device (UFS), etc.

The nonvolatile memory 4200 or the memory card system 4000 may be mounted using various types of packages, such as a PoP (package on package), a ball grid array (BGA), a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline (SOIC), a shrink small outline package (SSOP), a thin small outline (TSOP), a thin quad flatpack (TQFP), a system in package (SIP), a multi chip package (MCP), a wafer-level fabricated package (WFP) and a wafer-level processed stack package (WSP).

Figure 18:
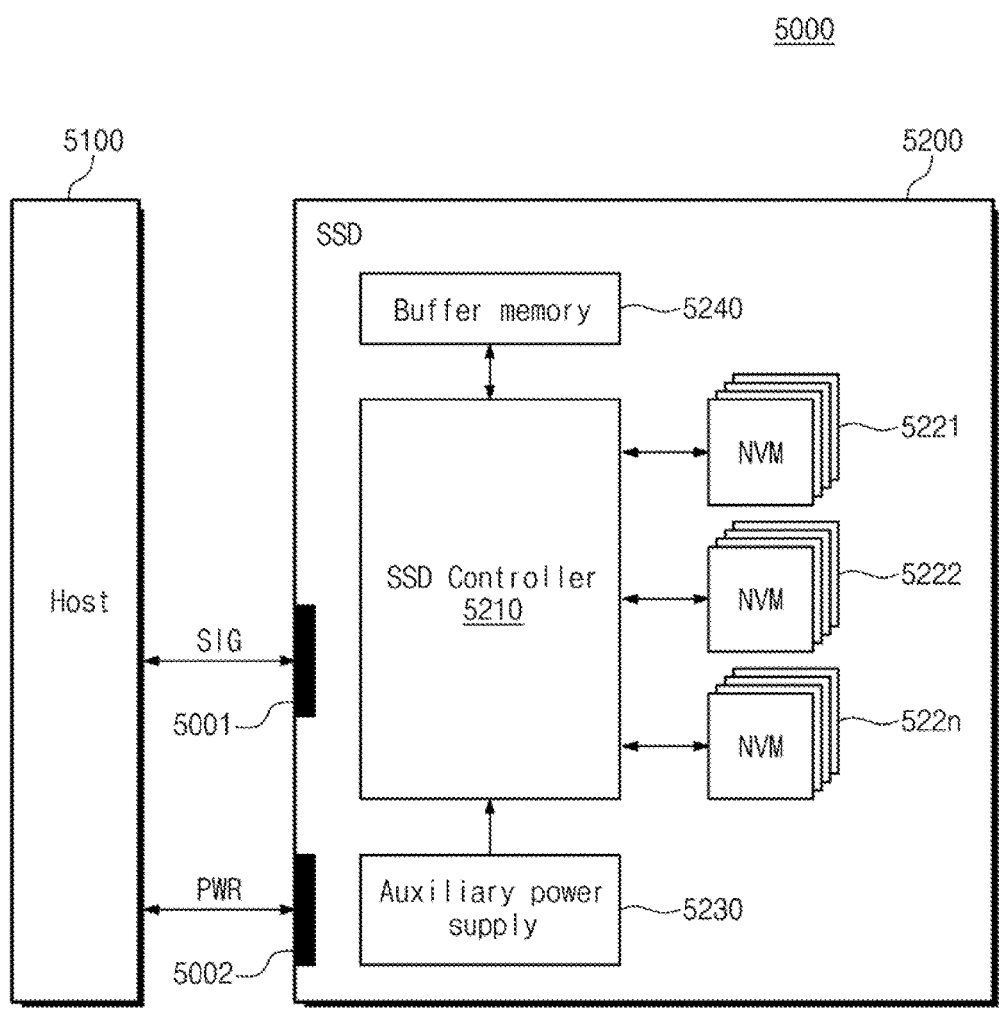
FIG. 18 is a block diagram of an SSD (solid state drive) system that includes a nonvolatile memory system in accordance with example embodiments of the inventive concept.

FIG. 18 is a block diagram of an SSD (solid state drive) system that includes a nonvolatile memory system in accordance with example embodiments of the inventive concept. Referring to FIG. 18, the SSD system 5000 includes a host 5100 and an SSD 5200. The SSD 5200 exchanges a signal with the host 5100 through a signal connector 5001 and receives a power supply through a power connector 5002. The SSD 5200 includes an SSD controller 5210, a plurality of non-volatile or flash memories NVM 5221~522n, an auxiliary power supply 5230 and a buffer memory 5240.

The SSD controller 5210 controls the flash memories 5221~522n in response to received signals SIG. The flash memories 5221~522n can perform program operations under control of the SSD controller 5210. The host 5100, as described above with reference to FIGS. 1 through 14, can determine an urgency level UL and transmit the determined urgency level UL to the SSD controller 5210. The signal SIG from the host 5100 includes information about the urgency level UL as described above. The SSD controller 5210, as described above with reference to FIGS. 1 through 14, can adjust an operation time of an operation being performed or to be performed based on the urgency level UL.

The SSD controller 5210, as described above with reference to FIGS. 15 and 16, can determine an urgency level UL based on pending commands and adjust an operation time of a command being performed.

The auxiliary power supply 5230 is connected to the host 5100 through the power connector 5002. The auxiliary power supply 5230 can be charged by power PWR received from the host 5100. If a power supply from the host 5100 is insufficient, the auxiliary power supply 5230 can provide power to the SSD system 5000. The auxiliary power supply 5230 may be located inside or outside the SSD 5200. For example, the auxiliary power supply 5230 is located on a main board and provides auxiliary power to the SSD 5200.

The buffer memory 5240 operates as a buffer memory of the SSD 5200. For example, the buffer memory 5240 can temporarily store data received from the host 5100, data received from the flash memories 5221~522n, or meta data, such as a mapping table, of the flash memories 5221~522n. The buffer memory 5240 can temporarily store a variety of information required for operation of the SSD controller 5210. The buffer memory 5240 may be a volatile memory such as a DRAM (Dynamic Random Access Memory), an SDRAM (Synchronous Dynamic Random Access Memory), a DDR SDRAM (Double Data Rate SDRAM), an LPDDR SDRAM (Low-Power DDR SDRAM), an SRAM (Static RAM) or a nonvolatile memory such as an FRAM (Ferroeletrics RAM), a ReRAM (Resistive RAM), an STT-MRAM (Spin-Transfer-Torque Magnetic RAM), or a PRAM (Phase-change RAM).

Figure 19:
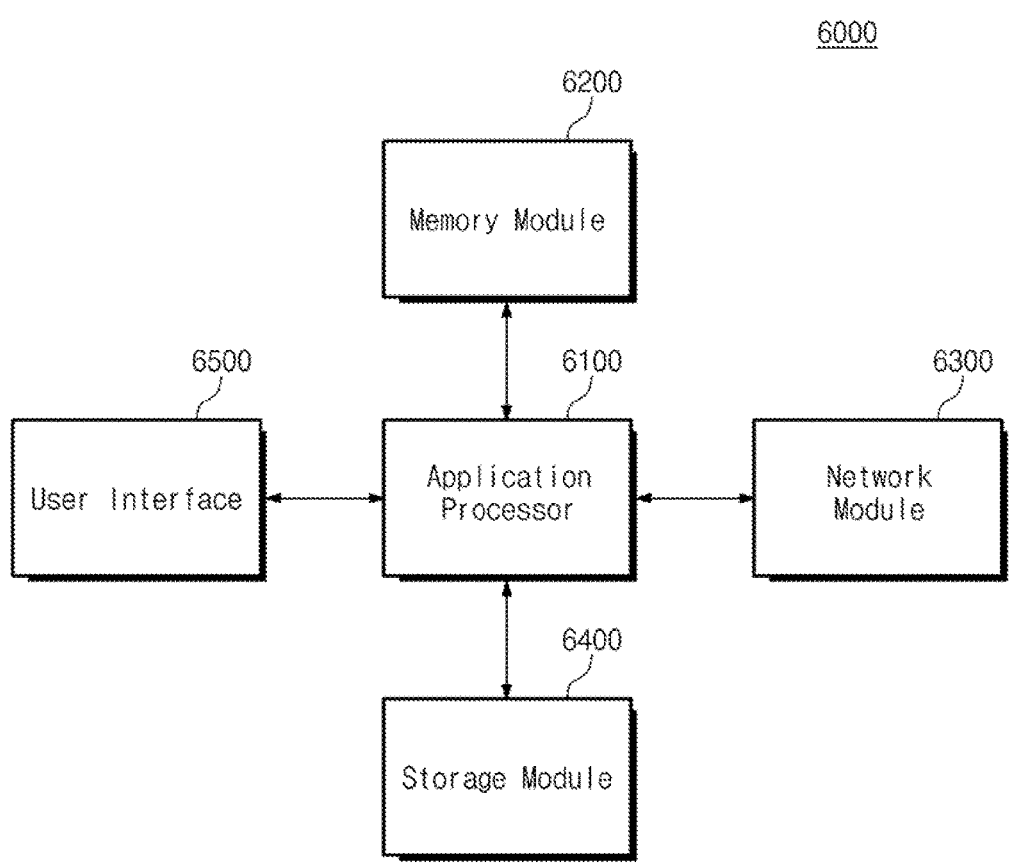
FIG. 19 is a block diagram of a user system that includes a nonvolatile memory system in accordance with example embodiments of the inventive concept.

FIG. 19 is a block diagram of a user system that includes a nonvolatile memory system in accordance with example embodiments of the inventive concept. Referring to FIG. 19, the user system 6000 includes an application processor 6100, a memory module 6200, a network module 6300, a storage module 6400 and a user interface 6500.

The application processor 6100 can drive constituent elements and an OS (operating system) included in the user system 6000. The application processor 6100 may include controllers that control constituent elements of the user system 6000, interfaces and a graphic engine. The application processor 6100 may be provided as a SoC (system-on-chip).

The memory module 6200 can operate as a main memory, an operation memory, a buffer memory or a cache memory of the user system 6000. The memory module 6200 may be a volatile random access memory such as a DRAM, an SDRAM, a DDR SDRAM, a DDR2 SDRAM, a DDR3 SDRAM, an LPDDR DRAM, an LPDDR2 DRAM, an LPDDR3 DRAM, etc., or be a nonvolatile random access memory such as a PRAM, a ReRAM, an MRAM, an FRAM, etc. The memory module 6200 may be packaged as a POP together with the application processor 6100.

The device driver described with reference to FIGS. 1 through 14 can be stored in the memory module 6200 or a cache memory in the application processor 6100 and can be driven by the application processor 6100. That is, the application processor 6100, as described with reference to FIGS. 1 through 14, can determine an urgency level UL.

The network module 6300 communicates with external devices. The network module 6300 may support a wireless communication such as a CDMA (code division multiple access), a GSM (global system for mobile communication), a WCDMA (wideband CDMA), a CDMA-2000, a TDMA (time division multiple access), a LTE (long term evolution), a Wimax, a WLAN, a UWB, a blue tooth, a WI-DI, etc. The network module 6300 may be included in the application processor 6100.

The storage module 6400 can store data. For example, the storage module 6400 stores data received from the application processor 6100. The storage module 6400 transmit data from the storage module 6400 to the application processor 6100. The storage module 6400 may be embodied as a nonvolatile semiconductor memory device such as a PRAM, a MRAM, a RRAM, a NAND flash, a NOR flash, a three-dimensional NAND flash, etc. The storage module 6400 can be a nonvolatile memory system described with reference to FIGS. 1 through 15.

The user interface 6500 may include interfaces that receive data or commands for the user system 6100 or output data to an external device. The user interface 6500 may include user input interface devices such as a key board, a key pad, a button, a touch panel, a touch screen, a touch pad, a touch ball, a camera, a microphone, a gyroscope sensor, a vibration sensor, a piezoelectric element, etc. The user interface 6500 may include user output interface devices such as a liquid crystal display (LCD), an organic light emitting diode (OLED) display device, an active crystal display (AMOLED) display device, a LED, a speaker, a motor, etc.

According to embodiments of the inventive concept, the host can determine an urgency level UL based on pending commands, such as unprocessed commands or commands to be performed, and transmits the determined urgency level UL to the nonvolatile memory system. The nonvolatile memory system adjusts an operation time of an operation being performed or an operation to be performed based on the urgency level UL. That is, since a nonvolatile memory system can adaptively perform operations of a command based on pending commands, a nonvolatile memory system can have improved performance.

According to embodiments of the inventive concept, when commands are concentrated by a request of a host, a nonvolatile memory system may process many commands within a short time by reducing an operation time of a command. Thus, a nonvolatile memory system can have improved performance.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of embodiments of the inventive concept is to be determined by the broadest permissible interpretation of the following claims and their equivalents, and shall not be restricted or limited by the foregoing detailed description.

What is claimed is:

1. A method of operating a nonvolatile memory system that includes a memory controller and a nonvolatile memory, the method comprising:
   receiving a command that includes an urgency level from an external device;
   adjusting an operation time of an operation of the command based on the urgency level; and
   completing the operation of the command within the adjusted operation time.

2. The method of claim 1, wherein the urgency level is one of a high level or a low level, based on pending commands in a command queue managed by the external device.

3. The method of claim 2, wherein if a number of pending commands is greater than a predetermined number, the urgency level is determined to be a high level, and if the number of pending commands is less than the predetermined number, the urgency level is determined to be a low level.

4. The method of claim 2, wherein if a number of priority commands among the pending commands is greater than a predetermined number, the urgency level is determined to be a high level, and if the number of priority commands among the pending commands is less than the predetermined number, the urgency level is determined to be a low level.

5. The method of claim 2, wherein if a pending time of the received command is greater than a predetermined time, the urgency level is determined to be a high level, and if the pending time of the received command is less than the predetermined time, the urgency level is determined to be a low level.

6. The method of claim 2, wherein adjusting an operation time of an operation of the command based on the urgency level comprises adjusting the operation time to be a first time when the urgency level is high, and adjusting the operation time to be a second time longer than the first time when the urgency level is low.

7. The method of claim 2, wherein if the received command is a write command,
   adjusting an operation time of an operation of the command based on the urgency level comprises:
   adjusting a trigger condition for garbage collection based on the urgency level and determining whether to perform garbage collection based on the adjusted trigger condition; and
   if performance of garbage collection is required, adjusting a performance time of the garbage collection based on the urgency level.

8. The method of claim 7, wherein adjusting the performance time of the garbage collection comprises adjusting the performance time of the garbage collection to be a first time when the urgency level is high and adjusting the performance time of the garbage collection to be a second time longer than the first time when the urgency level is low.

9. The method of claim 1, wherein the command is a signal defined by an interface between the external device and the nonvolatile memory system and the urgency level is included in a reserved area of the command.

10. The method of claim 1, wherein the nonvolatile memory comprises a three-dimensional memory array that includes a plurality of memory cells, and
    each of the memory cells comprises a charge trap layer.

11. A method operating of a nonvolatile memory system that includes a memory controller and a nonvolatile memory, the method comprising:
    receiving a command that includes an urgency level from an external device;
    selecting one of a plurality of operation states based on the urgency level; and
    performing an operation of the command based on the selected operation state,
    wherein, a number of write operations or read operations in each operation state is limited based on the urgency level while the operation of the command is performed.

12. The method of claim 11, wherein if a number of commands pending in the external device is greater than a predetermined number, the urgency level is high, and if the number of commands pending in the external device is less than the predetermined number, the urgency level is low.

13. The method of claim 12, wherein if the urgency level is high, the selected operation state is an urgent operation state,
    wherein the urgent operation state is an operation state in which a number of write operations or read operations performed during the operation of the command is limited to N, where N is an integer equal to or greater than 0.

14. The method of claim 13, wherein if the urgency level is low, the selected operation state is a normal operation state,
    wherein the normal operation state is an operation state in which the number of write operations or read operations performed during the operation of the command is limited to M, where M is an integer greater than N, or is not limited.

15. The method of claim 14, wherein the write operation and the read operation are performed in units of a page.

16. A method of operating a nonvolatile memory system that includes a memory controller and a nonvolatile memory, the method comprising:
    receiving a first command from an external device;
    performing an operation of the first command;
    receiving a state command that includes a changed urgency level;

adjusting an operation time of the operation of the first command based on the urgency level; and completing the operation of the first command within the adjusted operation time.

17. The method of claim 16, wherein performing an operation of the first command includes performing garbage collection to free a block for the operation of the first command.

18. The method of claim 16, wherein the urgency level is determined by the external device based on any one of a pending time of a pending command exceeding a critical time, a number of pending commands exceeding a critical value, or receiving by the external device a high priority command.

19. The method of claim 17, wherein adjusting an operation time of the operation of the first command includes minimizing an operation time of the garbage collection or stopping performance of the garbage collection and performing the operation of the first command.

20. The method of claim 16, further comprising, after completing the operation of the first command, transmitting a completion response to the external device.

* * * * *